(12) United States Patent
Hayashi et al.

(10) Patent No.: US 6,711,088 B2
(45) Date of Patent: Mar. 23, 2004

(54) SEMICONDUCTOR MEMORY DEVICE

(75) Inventors: Mitsuaki Hayashi, Kyoto (JP); Shuji Nakaya, Kobe (JP); Makoto Kojima, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/418,049

(22) Filed: Apr. 18, 2003

(65) Prior Publication Data

US 2003/0202374 A1 Oct. 30, 2003

(30) Foreign Application Priority Data

Apr. 26, 2002 (JP) ........................................ 2002-125707

(51) Int. Cl.[7] .................................................. G11C 8/00
(52) U.S. Cl. ............................. 365/230.06; 365/189.08
(58) Field of Search ............................ 365/94, 230.06, 365/230.08, 230.03, 189.08, 203

(56) References Cited

U.S. PATENT DOCUMENTS 6,377,508 B1    4/2002   Tomishima et al. .... 365/230.06
6,600,672 B2 *  7/2003   Hayashi ..................... 365/104

* cited by examiner

*Primary Examiner*—Van Thu Nguyen
*Assistant Examiner*—Hien Nguyen
(74) *Attorney, Agent, or Firm*—Stevens, Davis, Miller & Mosher, LLP

(57) ABSTRACT

By eliminating a current of bit lines which is generated regularly by an off-leak current in memory cells, the number of memory cells per bit line is made to increase, large storage capacity of the memory cell array is achieved, and a semiconductor memory device capable of reducing a chip area is provided. In order to achieve it, provided is a source line potential control circuit for setting a source potential of transistors included in the memory cells being selected by row selection signals at a ground potential, and for setting a source potential of the transistors included in the memory cells being set as a non-selection state by the row selection signals at a power potential. A potential difference between sources and drains of the transistors included in the memory cells of the non-selection state is thereby reduced, and the leakage current is eliminated.

17 Claims, 18 Drawing Sheets

FIG. 2

CLP1

CLN1

CLPj (j=2~n)

CLNj (j=2~n)

PCLK1 — t

BL11

WL1

GL11

WLi (i=2~m) "L" level

GL1i (i=2~m) "H" level

SOUT1

SEL "L" level

DOUT

PRIOR ART
FIG. 18

CLP1

CLN1

CLPj
(j=2~n)

CLNj
(j=2~n)

PCLK1    t

BL11

WL1

WLi    "L" level
(i=2~m)

SOUT1

SEL    "L" level

DOUT

SEMICONDUCTOR MEMORY DEVICE

BACKGROUND OF THE INVENTION

1. Field of the Invention

The present invention relates to a semiconductor memory device, and more particularly to circuit technology for achievement in large-scaling of a memory cell array.

2. Description of the Prior Art

FIG. 17 is a circuit diagram showing an example of a mask ROM configuration of a contact method (contact mask programming method) in accordance with a conventional semiconductor memory device. The mask ROM of the contact method makes it correspond to "0" or "1" of stored data whether a drain of a memory cell transistor is connected to a bit line, or not connected thereto, respectively. In FIG. 17, the conventional semiconductor memory device comprises memory cell arrays 1 and 2, column decoders 3 and 4, transistors 5 and 6 for precharge, readout circuits 7 and 8, and an output selection circuit 9.

The memory cell array 1 is configured so that memory cells M1 (i, j) (i=1−m, j=1−n) which consist of N-channel MOS transistors may be arranged in a matrix configuration, i.e., forming rows and columns.

Gates of the N-channel MOS transistors which configure each memory cell M1 (i, j) are connected in common to word lines every n memory cells M1 (i, j) which have the same numeric value i and are arranged in a row direction. In addition, sources of these N-channel MOS transistors are connected in common to source lines GL1i (i=1−m) every n memory cells M1 (i, j) which have the same numeric value i and are arranged in the row direction. Furthermore, when stored data of the memory cell M1 (i, j) is "0", the drain of this N-channel MOS transistor is made to connect to a bit line BL1j (j=1−n), and when the stored data of the memory cell M1 (i, j) is "1", it is brought to a floating state. In the discussion hereinafter, a gate, a drain, and a source of the each N-channel MOS transistor which configures the memory cell M1 (i, j) will simply be referred to as the gate, the drain, and the source of the memory cell M1 (i, j).

In the conventional example, the gates of n memory cells M1 (i, j) which have the same numeric value i and are arranged in the row direction are connected to word line terminals WLi (i=1−m), respectively, into which row selection signals are inputted. Moreover, the source lines GL1i (i=1−m) are connected to a ground terminal having a ground potential.

The memory cell array 2 is configured so that memory cells M2 (i, j) (i=1−m, j=1−n) which consist of N-channel MOS transistors may be arranged in the matrix configuration, i.e., forming rows and columns.

Gates of the N-channel MOS transistors which configure each memory cell M2 (i, j) are connected in common to the word lines every n memory cells M2 (i, j) which have the same numeric value i and are arranged in the row direction. Moreover, sources of these N-channel MOS transistors are connected in common to source lines GL2i (i=1−m) every n memory cells M2 (i, j) which have the same numeric value i and are arranged in the row direction. Furthermore, when stored data in the memory cell M2 (i, j) is "0", the drain of this N-channel MOS transistor is made to connect to bit line BL2j (j=1−n), and when the stored data in the memory cell M2 (i, j) is "1", it is brought to the floating state. In the discussion hereinafter, a gate, a drain, and a source of the each N-channel MOS transistor which configures the memory cell M2 (i, j) will simply be referred to as the gate, the drain, and the source of the memory cell M2 (i, j).

In the conventional example, the gates of n memory cells M2 (i, j) which have the same numeric value i and are arranged in the row direction are connected to the word line terminals WLi (i=1−m), respectively, into which the row selection signals are inputted. Moreover, source lines GL2i (i=1−m) are connected to the ground terminal having the ground potential.

The column decoder 3 consists of P-channel MOS transistors Q1Pj (j=1−n) and N-channel MOS transistors Q1Nj (j=1−n). All sources of the P-channel MOS transistors Q1Pj (j=1−n) and drains of N-channel MOS transistors Q1Nj (j=1−n) are connected in common. Moreover, gates of the P-channel MOS transistors Q1Pj (j=1−n) are connected to column selection signal lines CLPj (j=1−n), respectively, and drains thereof are connected to bit lines BL1j (j=1−n), respectively. Moreover, gates of the N-channel MOS transistors Q1Nj (j=1−n) are connected to column selection signal lines CLNj (j=1−n), respectively, and sources thereof are connected to bit lines BL1j (j=1−n), respectively.

The column decoder 4 consists of P-channel MOS transistors Q2Pj (j=1−n) and N-channel MOS transistors Q2Nj (j=1−n). All sources of the P-channel MOS transistors Q2Pj (j=1−n) and drains of N-channel MOS transistors Q2Nj (j=1−n) are connected in common. Moreover, gates of the P-channel MOS transistors Q2Pj (j=1−n) are connected to the column selection signal lines CLPj (j=1−n), respectively, and drains thereof are connected to the bit lines BL2j (j=1−n), respectively. Moreover, gates of the N-channel MOS transistors Q2Nj (j=1−n) are connected to the column selection signal lines CLNj (j=1−n), respectively, and sources thereof are connected to the bit lines BL2j (j=1−n), respectively.

The transistor 5 for precharge consists of a P-channel MOS transistor. Then, a gate of the transistor 5 is connected to a precharge control signal line PCLK1, a source thereof is connected to a power supply terminal having a power supply potential, and a drain thereof is connected to the sources of the P-channel MOS transistors Q1Pj (j=1−n) and the drains of the N-channel MOS transistors Q1Nj (j=1−n) which configure the column decoder 3.

The transistor 6 for precharge consists of a P-channel MOS transistor. Then, a gate of the transistor 6 is connected to a precharge control signal line PCLK2, a source thereof is connected to the power supply terminal having the power supply potential, and a drain thereof is connected to the sources of the P-channel MOS transistors Q2Pj (j=1−n) and the drains of the N-channel MOS transistors Q2Nj (j=1−n) which configure the column decoder 4.

The readout circuit 7, whose input is connected to the drain of the transistor 5 for precharge, and the sources of the P-channel MOS transistors Q1Pj (j=1−n) and the drains of the N-channel MOS transistors Q1Nj (j=1−n) which configure the column decoder 3, and outputs data to a readout data line SOUT1. In the conventional example, assuming that when the stored data in the memory cell M1 (i, j) is "0", the readout data line SOUT1 is brought to a low level, and when the stored data in the memory cell M1 (i, j) is "1", the readout data line SOUT1 is brought to a high level.

The readout circuit 8, whose input is connected to the drain of the transistor 6 for precharge, and the sources of the P-channel MOS transistors Q2Pj (j=1−n) and the drains of the N-channel MOS transistors Q2Nj (j=1−n) which configure the column decoder 4, outputs data to a readout data line SOUT2. In the conventional example, assuming that when the stored data in the memory cell M2 (i, j) is "0", the readout data line SOUT2 is brought to the low level, and when the stored data in the memory cell M2 (i, j) is "1", the readout data line SOUT2 is brought to the high level.

The output selection circuit 9, into which signals of the readout data lines SOUT1 and SOUT2, and a readout data selection line SEL are inputted, outputs data to an output terminal DOUT. In the conventional example, assuming that while the readout data selection SEL stays in the low level, the output terminal DOUT outputs the data of the readout data line SOUT1, and while the readout data selection SEL stays in the high level, the output terminal DOUT outputs the data of the readout data line SOUT2.

Using the timing chart in FIG. 18, a description will be made of an operation for reading the data of the memory cell M1 (1, 1) in the semiconductor memory device configured as mentioned above. In signal waveforms of a bit line BL11, the readout data line SOUT1, and the output terminal DOUT shown in FIG. 18, solid lines show a case where the drain of the memory cell M1 (1, 1) is not connected to the bit line BL11, and dotted lines show a case where the drain of the memory cell M1 (1, 1) is connected to the bit line BL11.

First, among the column selection signal lines CLPj (j=1-n) and the column selection signal lines CLNj (j=1-n), a column selection signal line CLP1 is made a transition to the low level and column selection signal lines CLP2-CLPn are made the transition to the high level, and further, a column selection signal line CLN1 is made the transition to the high level and the column selection signal lines CLN2-CLNn are made the transition to the low level. Thereby, among the transistors Q1Pj (j=1-n) and the Q1Nj (j=1-n) which configure the column decoder 3, a transistor Q1P1 and a transistor Q1N1 are brought to an ON state, and other transistors Q1P2-Q1Pn and the transistors Q1N2-Q1Nn are brought to an OFF state. Moreover, all word line terminals WL1-WLm are made the transition to the low level.

Next, the precharge control signal line PCLK1 is brought to the low level only for a period t, and the transistor 5 for precharge is brought to the ON state for a constant period of time. Thereby, the bit line BL11 is charged to bring it to the high level.

After the bit line BL11 is brought to the high level, the word line terminal WL1 is made the transition from the low level being a non-selection state to the high level being a selection state. Thereby, when the drain of the memory cell M1 (1, 1) is connected to the bit line BL11, the electric charge charged in the bit line BL11 is discharged by the memory cell M1 (1, 1), and the bit line BL11 is brought to the low level. Moreover, when the drain of the memory cell M1 (1, 1) is not connected to the bit line BL11, the electric charge charged in the bit line BL11 is not discharged by the memory cell M1 (1, 1), and the bit line BL11 keeps the high level.

Consequently, in the readout circuit 7, when the drain of the memory cell M1 (1, 1) is connected to the bit line BL11, the readout data line SOUT1 is brought to the low level. Moreover, when the drain of the memory cell M1 (1, 1) is not connected to the bit line BL11, the readout data line SOUT1 is brought to the high level. At this time, by bringing the readout data selection SEL to the low level, the output selection circuit 9 outputs the data of the same level as the readout data line SOUT1 to the output terminal DOUT.

The conventional semiconductor memory devices have the following problems.

In the semiconductor memory device, since the drains of a plurality of the memory cells, whose source potential are set at the ground potential, are connected to one bit line, a steady state current due to an off-leak current of the memory cells is generated in the bit lines. Accordingly, the number of memory cells connected to the bit lines has been limited to the number the same as can be precharged up to a desired potential, even when the steady state current is generated by the off-leak current.

Particularly, in recent years, it is needed to increase the number of the memory cells connected to one bit line for the purpose of increasing the memory capacity according to advanced features of equipment. Especially, it should be recognized that the off-leak current of the transistor caused by fine patterning is acceleratively increasing, and the above-mentioned problems have been major concerns for achieving high performance of the semiconductor memory device.

SUMMARY OF THE INVENTION

The present invention overcomes the problems seen in the conventional semiconductor memory device described above, and by reducing the off-leak current of the memory cells connected to the bit line for reading, and thereby, enabling the increase in the number of the memory cells connected to the bit lines, that is, being capable of realizing an increase in the memory capacity is provided.

In order to achieve the object described above, the semiconductor memory device in accordance with the present invention employs a configuration where the source potential of the memory cells is set at a desired potential.

The semiconductor memory device according to a 1st invention comprises: a memory cell array having transistors for forming a plurality of memory cells arranged in a matrix configuration, and including a plurality of word lines, bit lines, and source lines connected to gates, drains, and sources of the transistors respectively; and a source potential control circuit for selectively setting potentials of the source lines according to the row selection signals for selecting word lines.

Then, the source potential control circuit sets potentials of source lines, out of the source lines, connected to unselected memory cells, in accordance with the row selection signals, at a potential different from a potential of a source line connected to memory cells being selected by the row selection signals so that the off-leak current of transistors included in memory cells being set as a non-selection state may decrease.

According to the semiconductor memory device of the 1st invention, it becomes possible to precharge the bit lines up to the desired potential even when a number of memory cells are connected by setting the source potential of the memory cell transistors at the arbitrary potential, without reducing the number of the memory cells connected to one bit line because of the off-leak current value of the transistors. Accordingly, a number of memory cells can be connected thereto and the large-scaling of the memory capacity of the semiconductor memory device can be achieved easily.

In the configuration of the semiconductor memory device according to the 1st invention, it is preferable to configure that the source potential control circuit sets a source potential of transistors for memory cells being selected by the row selection signals for selecting the word line at a ground potential, and sets a source potential of transistors for memory cells being set as a non-selection state by the row selection signals at the power supply potential.

According to the semiconductor memory device of the above-mentioned configuration, the same effect as that of the semiconductor memory device of the 1st invention is provided.

In the configuration of the semiconductor memory device having the source potential control circuit configured as described above, the source potential control circuit comprises, for example, inverters each for receiving a corresponding one of the row selection signals as an input, and providing an output to sources of corresponding ones of the transistors which receive the corresponding one of the row selection signals.

According to the semiconductor memory device of the above-mentioned configuration, the same effect as that of the semiconductor memory device of the 1st invention is provided.

The semiconductor memory device according to a 2nd invention comprises: a memory cell array having transistors for forming a plurality of memory cells arranged in a matrix configuration, and including a plurality of word lines, bit lines, and source lines connected to gates, drains, and sources of the transistors respectively; and a source potential control circuit for setting a source potential of the transistors for memory cells being selected by row selection signals for selecting the word lines at a ground potential, and for setting a source potential of transistors for memory cells being set as a non-selection state by the row selection signals at a floating potential.

According to the semiconductor memory device of the 2nd invention, the same effect as that of the semiconductor memory device of the 1st invention is provided.

In the semiconductor memory device according to the 2nd invention, the source potential control circuit comprises, for example, transistors each receiving a corresponding one of the row selection signals to gate thereof, having a source connected to the ground terminal, and having a drain connected to sources of corresponding ones of the transistors which receive the corresponding one of the row selection signals.

According to the semiconductor memory device of the above-mentioned configuration, the same effect as that of the semiconductor memory device of the 1st invention is provided.

In the semiconductor memory device according to the 1st invention, it is preferable to configure the source potential control circuit that a source potential of transistors for memory cells selected by the row selection signals for selecting the word line is set at a ground potential, and a source potential of transistors for memory cells being set as a non-selection state by the row selection signals are set at an intermediate potential between the power supply potential and the ground potential.

According to the semiconductor memory device of the above-mentioned configuration, the same effect as that of the semiconductor memory device of the 1st invention is provided.

In the semiconductor memory device according to the configuration described as above, the source potential control circuit comprises: inverters which receives, for example, the row selection signals as inputs; 1st transistors each having a gate connected to an output of a corresponding one of the inverters, having a drain connected to a power supply terminal, and having a source connected to sources of corresponding ones of the transistors which receive a corresponding one of the row selection signals; and 2nd transistors each having a gate receiving a corresponding one of the row selection signals, having a sources connected to the ground potential, and having a drains connected to sources of corresponding ones of the transistors which receive the corresponding one of the row selection signals.

According to the semiconductor memory device of this configuration, the same effect as that of the semiconductor memory device of the 1st invention is provided.

The semiconductor memory device according to a 4th invention comprises: in the configuration of the semiconductor memory device according to the 1st invention, the plurality of memory cells arranged into a plurality of memory cell arrays, and the semiconductor memory device further comprises: a 1st repeat circuit including 1st inverters connected to corresponding ones of the word lines at inputs thereof, and 2nd inverters connected to outputs of the 1st inverters at inputs thereof; and a 2nd repeat circuit including 3rd inverters connected to corresponding ones of the source lines at inputs thereof and 4th inverters connected to outputs of the 3rd inverters at inputs thereof.

Then, in the 1st repeat circuit, the outputs of the 2nd inverters are connected to word lines provided in a memory cell array different from a memory cell array in which word lines connected to the inputs of the 1st inverters are provided. Moreover, in the 2nd repeat circuit, the outputs of the 4th inverters are connected to source lines provided in a memory cell array different from a memory cell array in which source lines connected to the input of the 3rd inverters are provided. Furthermore, the 1st repeat circuit and the 2nd repeat circuit are formed between at least two of the memory cell arrays.

According to the semiconductor memory device of the 3rd invention, the same effect as that of the semiconductor memory device of the 1st invention is provided.

The semiconductor memory device according to a 4th invention comprises: in the configuration of the semiconductor memory device according to the 1st invention, the plurality of memory cells arranged into a plurality of memory cell arrays, and the semiconductor memory device further comprises: a repeat circuit including 1st inverters connected to corresponding ones of source lines at inputs thereof and 2nd inverters connected to outputs of the 1st inverters at inputs thereof.

Then, in the repeat circuit, the outputs of the 2nd inverters are connected to source lines provided in a memory cell array different from a memory cell array in which source lines connected to the inputs of the 1st inverters are provided. Moreover, the repeat circuit is formed between at least two of the memory cell arrays.

According to the semiconductor memory device of the 4th invention, the same effect as that of the semiconductor memory device of the 1st invention is provided.

The semiconductor memory device according to a 4th invention comprises: in the configuration of the semiconductor memory device according to the 1st invention, the plurality of memory cells arranged into a plurality of memory cell arrays, and the semiconductor memory device further comprises: 1st inverters connected to word lines at inputs thereof and to the source lines at outputs thereof; and 2nd inverters connected to the source lines at inputs thereof and to the word lines at outputs thereof.

Then, the outputs of the 1st inverters are connected to source lines provided in a memory cell array different from a memory cell array in which word lines connected to the inputs of the 1st inverters are provided. Moreover, the outputs of the 2nd inverters are connected to word lines provided in a memory cell array different from a memory cell array in which source lines connected to the inputs of the 2nd inverters are provided. Furthermore, the 1st inverters and the 2nd inverters are formed between at least two of the memory cell arrays.

According to the semiconductor memory device of the 5th invention, the same effect as that of the semiconductor memory device of the 1st invention is provided.

The semiconductor memory device according to a 4th invention comprises: in the configuration of the semiconductor memory device according to the 1st invention, the plurality of memory cells arranged into a plurality of memory cell arrays, and the semiconductor memory device further comprises: a repeat circuit including inverters connected to corresponding ones of word lines at inputs thereof, and connected to corresponding ones of the source lines at outputs thereof.

In addition, the repeat circuit is formed between at least two of the memory cell arrays.

According to the semiconductor memory device of the 6th invention, the same effect as that of the semiconductor memory device of the 1st invention is provided.

The semiconductor memory device according to a 4th invention comprises: in the configuration of the semiconductor memory device according to the 1st invention, the plurality of memory cells arranged into a plurality of memory cell arrays, and the semiconductor memory device further comprises: a repeat circuit including inverters connected to corresponding ones of the source lines at inputs thereof, and connected to corresponding ones of the word lines at outputs thereof. In addition, the repeat circuit is formed between at least two of the memory cell arrays.

According to the semiconductor memory device of the 7th invention, the same effect as that of the semiconductor memory device of the 1st invention is provided.

The semiconductor memory device according to a 4th invention comprises: in the configuration of the semiconductor memory device according to the 1st invention, the plurality of memory cells arranged into a plurality of memory cell arrays, and the semiconductor memory device further comprises: a 1st repeat circuit including inverters connected to corresponding ones of the word lines at inputs thereof, and connected to corresponding ones of the source lines; and a 2nd repeat circuit including inverters connected to the source lines to inputs, and connecting word lines of the same rows as the inputs to the outputs.

In addition, the 1st repeat circuit and the 2nd repeat circuit are each formed between at least two of the memory cell arrays.

According to the semiconductor memory device of the 8th invention, the same effect as that of the semiconductor memory device of the 1st invention is provided.

The semiconductor memory device according to a 9th invention comprises: a plurality of memory cell arrays having transistors for forming a plurality of memory cells in a matrix configuration, and including a plurality of wordlines, bit lines, and source lines connected to gates, drains, and sources of the transistors respectively; and a source potential control circuit for receiving the row selection signals for selecting the word lines and memory cell array selection signals provided for respective memory cell arrays at inputs thereof, respectively, for supplying outputs to respective source lines in a corresponding one of the memory cell arrays, and for setting the potential of source lines connected to transistors included in memory cells selected by the memory cell array selection signal and the row selection signals at the ground potential.

Then, the source potential control circuit is formed in each memory cell array.

According to the semiconductor memory device of the 9th invention, the same effect as that of the semiconductor memory device of the 1st invention is provided.

In the 9th configuration according to the invention, the source potential control circuit comprises NAND circuits for receiving, for example, the row selection signals for selecting the word line and the memory cell array selection signals provided for respective memory cell arrays at inputs thereof, respectively, and for providing the outputs to respective source lines in the corresponding one of the memory cell array.

According to the semiconductor memory device of the above-mentioned configuration, the same effect as that of the semiconductor memory device of the 1st invention is provided.

The semiconductor memory device according to a 10th invention comprises: a memory cell array having transistors for forming a plurality of memory cells in a matrix configuration, and including a plurality of word lines, bit lines, and source lines connected to gates, drains, and sources of the transistors respectively; and a plurality of source line potential control circuits each connected to a source selection line at inputs thereof and connected to a plurality of source lines at outputs thereof.

Then, the plurality of source line potential control circuits set a potential of source lines connected to transistors included in memory cells selected by the row selection signals for selecting the word line at the ground potential.

According to the semiconductor memory device of the 10th invention, the same effect as that of the semiconductor memory device of the 1st invention is provided.

The semiconductor memory device according to a 11th invention comprises a memory cell array having transistors for forming a plurality of memory cells in a matrix configuration, and including word lines, bit lines, and source lines connected to gates, drains, and sources of the transistors respectively, and a plurality of inverters for receiving source potential control signals at inputs thereof and providing outputs to a plurality of source lines.

Then, only an output potential of an inverter, out of said inverters, connected to a source line of transistors included in memory cells selected by the row selection signal is set at the ground potential.

According to the semiconductor memory device of the 11th invention, the same effect as that of the semiconductor memory device of the 1st invention is provided.

BRIEF DESCRIPTION OF THE DRAWINGS

FIG. 2 is a timing chart showing an operation of a semiconductor memory device according to the 1st embodiment of the present invention;

FIG. 18 is a timing chart showing an operation of a conventional semiconductor memory device.

DETAILED DESCRIPTION OF THE INVENTION

1st Embodiment

Figure 1:
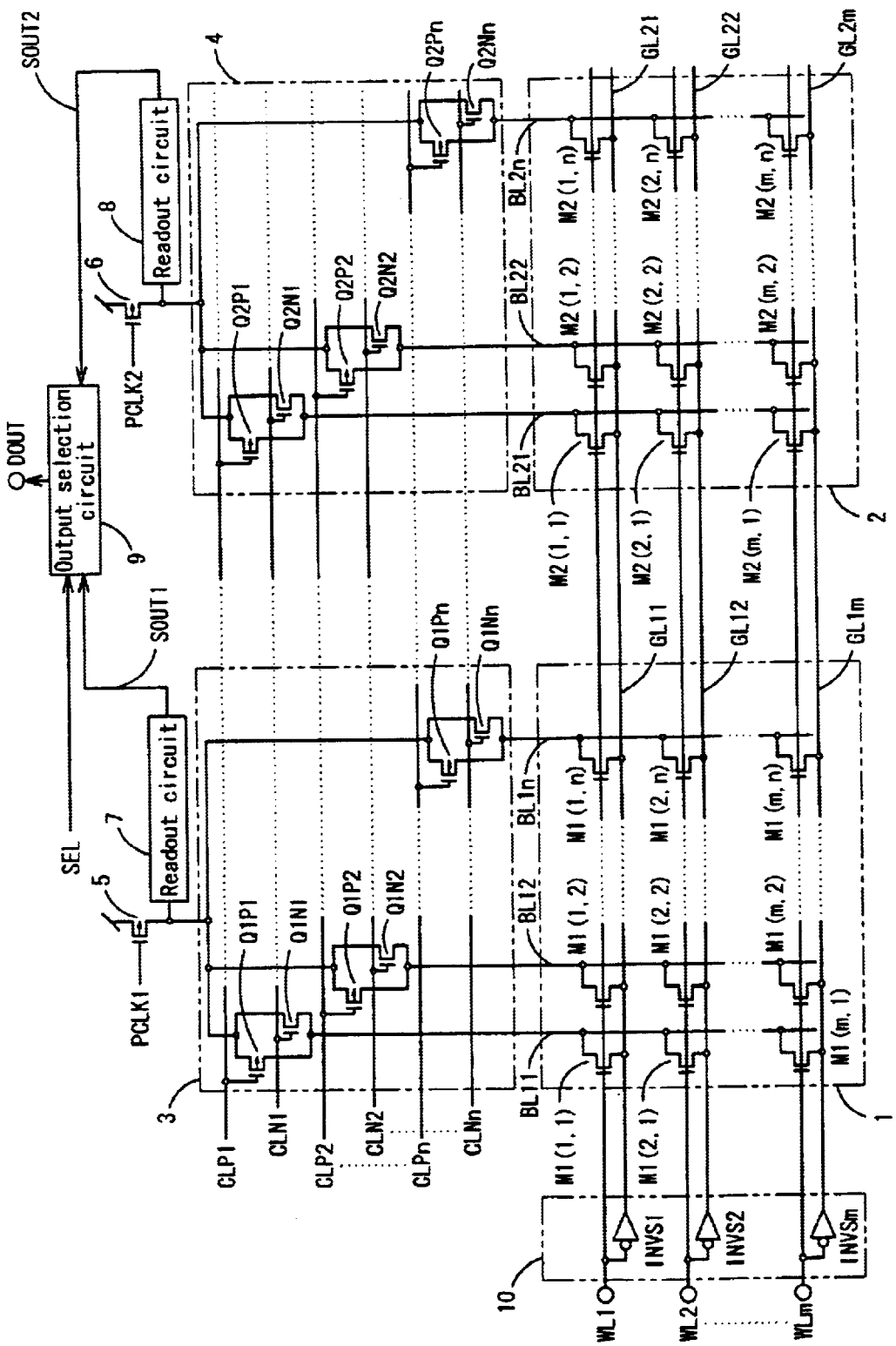
FIG. 1 is a circuit diagram showing a configuration of a semiconductor memory device according to a 1st embodiment of the present invention.

FIG. 1 is a circuit diagram showing a configuration of a semiconductor memory device according to a 1st embodiment of the present invention.

Referring now to FIG. 1, the semiconductor memory device comprises memory cell arrays 1 and 2, column decoders 3 and 4, transistors 5 and 6 for precharge, readout circuits 7 and 8, an output selection circuit 9, and a source potential control circuit 10. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The source potential control circuit 10 consists of inverters INVSi (i=1–m). In the inverters INVSi (i=1–m), inputs are connected to word line terminals WLi (i=1–m), respectively, and outputs are connected to source lines GL1i (i=1–m) and source lines GL2i (i=1–m), respectively.

Using the timing chart in FIG. 2, a description will be made of an operation for reading the data of the memory cell M1 (1, 1) in the semiconductor memory device configured as mentioned above. In signal waveforms of a bit line BL11, a readout data line SOUT1, and an output terminal DOUT shown in FIG. 2, solid lines show a case where a drain of the memory cell M1 (1, 1) is not connected to the bit line BL11, and dotted lines show a case where the drain of the memory cell M1 (1, 1) is connected to the bit line BL11.

First, among column selection signal lines CLPj (j=1–n) and column selection signal lines CLNj (j=1–n), the column selection signal line CLP1 is made a transition to a low level and column selection signal lines CLP2–CLPn are made the transition to a high level, and further, a column selection signal line CLN1 is made the transition to the high level and column selection signal lines CLN2–CLNn are made the transition to the low level. Thereby, among transistors Q1Pj (j=1–n) and Q1Nj (j=1–n) which configure the column decoder 3, a transistor Q1P1 and a transistor Q1N1 are brought to an ON state, and other transistors Q1P2–Q1Pn and transistors Q1N2–Q1Nn are brought to an OFF state. Moreover, all word line terminals WL1–WLm are made the transition to the low level.

Next, a precharge control signal line PCLK1 is brought to the low level only for a period t, and the transistor 5 for precharge is brought to the ON state for a constant period of time. Thereby, the bit line BL11 is charged to bring to the high level.

After the bit line BL11 is brought to the high level, the word line terminal WL1 is made the transition from the low level being a non-selection state to the high level being a selection state. Consequently, among the inverters INVSi (i=1–m) configuring the source potential control circuit 10, a source line GL11 connected to the output of the inverter INVS1 is brought to the low level, and source lines GL12–GL1m connected to the outputs of the inverters INVS2–INVSm are brought to the high level. Thereby, when the drain of the memory cell M1 (1, 1) is connected to the bit line BL11, the electric charge charged in the bit line BL11 is discharged by the memory cell M1 (1, 1), and the bit line BL11 is brought to the low level. Thereby, when the drain of the memory cell M1 (1, 1) is not connected to the bit line BL11, the electric charge charged in the bit line BL11 is not discharged by the memory cell M1 (1, 1), and the bit line BL11 keeps the high level.

Consequently, in the readout circuit 7, when the drain of the memory cell M1 (1, 1) is connected to the bit line BL11, the readout data line SOUT1 is brought to the low level. Moreover, when the drain of the memory cell M1 (1, 1) is not connected to the bit line BL11, the readout data line SOUT1 is brought to the high level. At this time, by bringing a readout data selection SEL to the low level, the output selection circuit 9 outputs the data of the same level as the readout data line SOUT1 to the output terminal DOUT.

As described above, according to this embodiment, by bringing the source lines of the memory cells connected to the non-selected word line terminals to the high level, and making it equivalent to the precharge potential of the bit lines, this makes it possible to reduce the potential difference between the source and the drain of the non-selected memory cells, to reduce an off-leak current significantly, and to charge the bit lines to a desired potential.

2nd Embodiment

Figure 3:
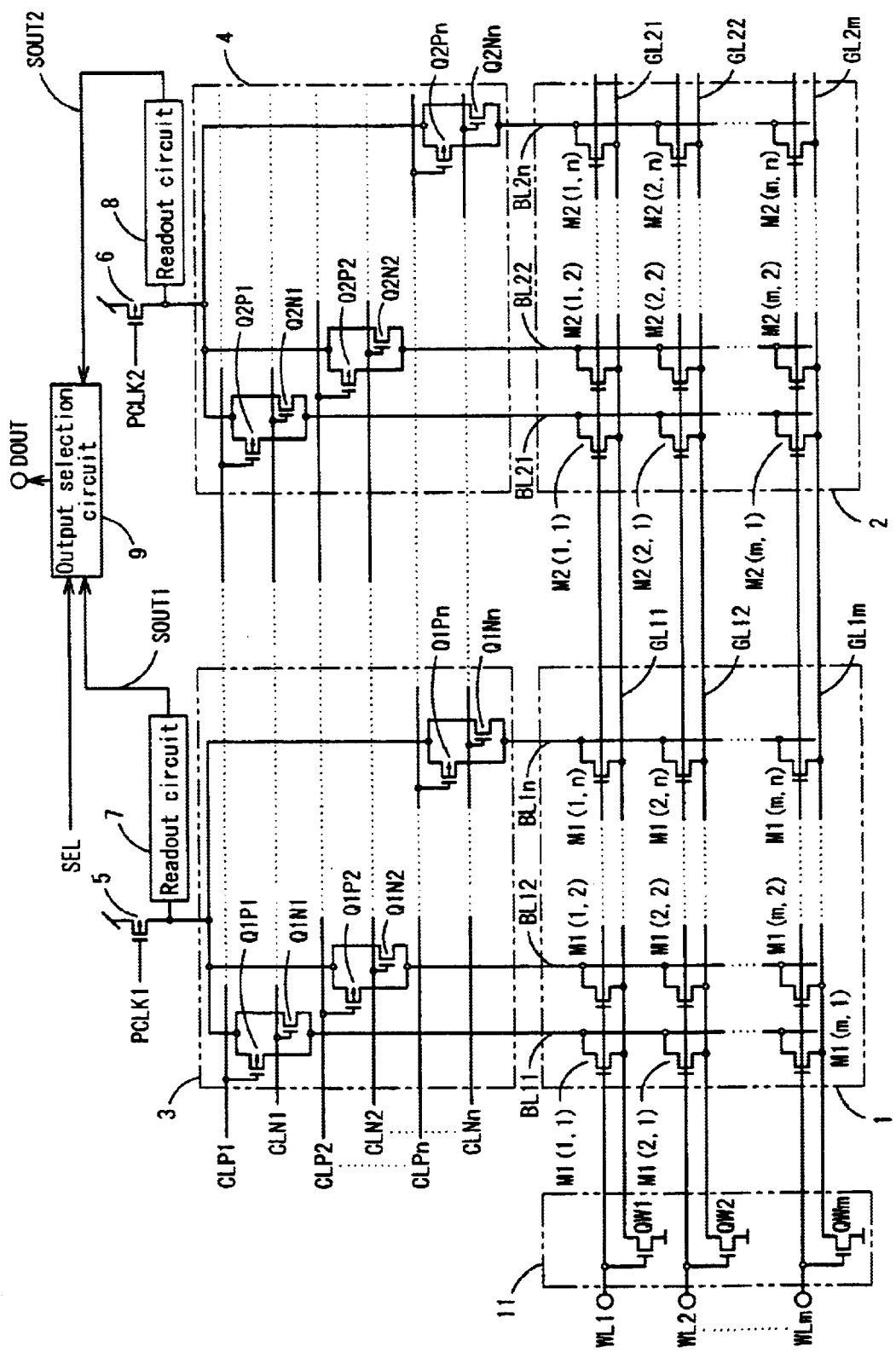
FIG. 3 is a circuit diagram showing a configuration of a semiconductor memory device according to the 2nd embodiment of the present invention.

FIG. 3 is a circuit diagram showing a configuration of a semiconductor memory device according to a 2nd embodiment of the present invention.

Referring now to FIG. 3, the semiconductor memory device comprises memory cell arrays 1 and 2, column decoders 3 and 4, transistors 5 and 6 for precharge, readout circuits 7 and 8, an output selection circuit 9, and a source potential control circuit 11. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The source potential control circuit 11 consists of N-channel MOS transistors QWi (i=1–m). In N-channel MOS transistors QWi (i=1–m), gates are connected to the word line terminals WLi (i=1–m), respectively, and drains are connected to the source lines GL1i (i=1–m) and the source lines GL2i (i=1–m), respectively, and sources are connected to the ground terminal having the ground potential.

Figure 4:
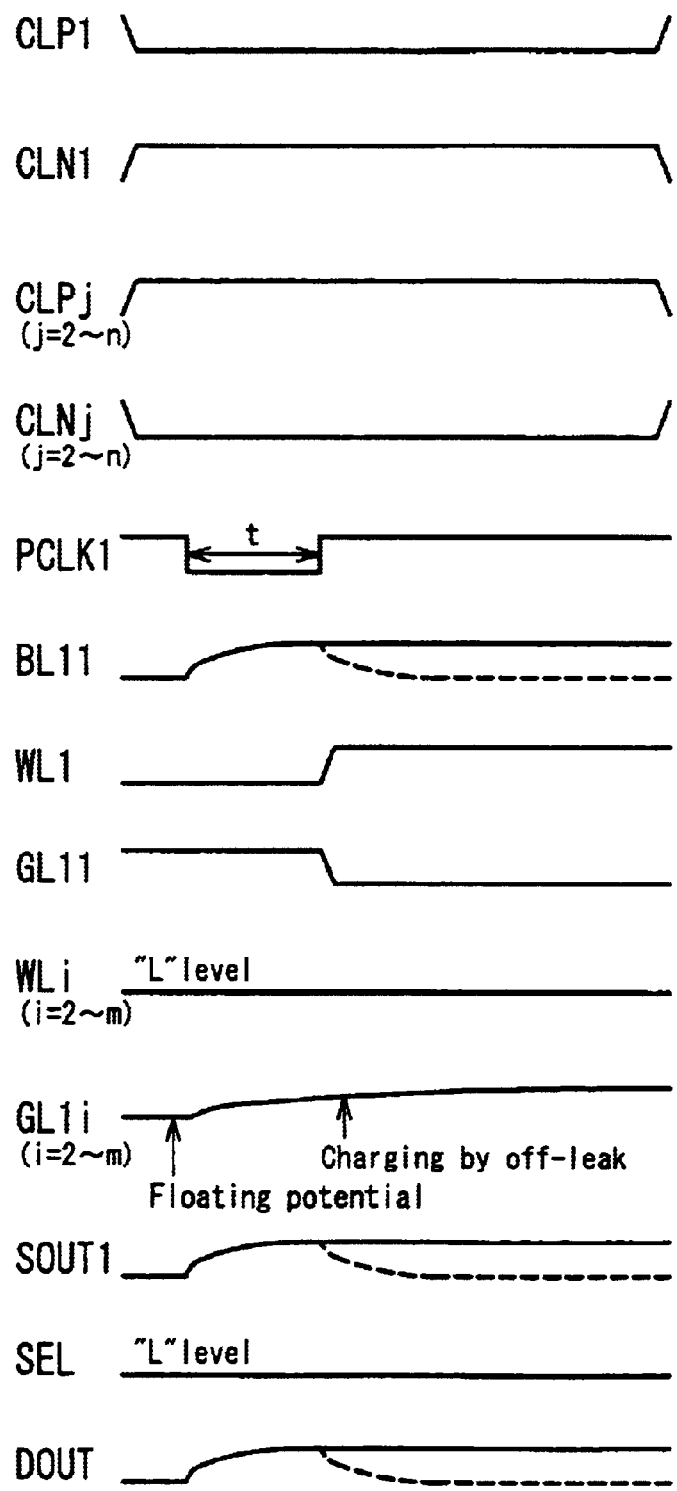
FIG. 4 is a timing chart showing an operation of a semiconductor memory device according to the 2nd embodiment of the present invention.

Using the timing chart in FIG. 4, a description will be made of an operation for reading the data of the memory cell M1 (1, 1) in the semiconductor memory device configured as mentioned above. In signal waveforms of the bit line BL11, the readout data line SOUT1, and the output terminal DOUT shown in FIG. 4, the solid lines show a case where the drain of the memory cell M1 (1, 1) is not connected to the bit line BL11, and the dotted lines show a case where the drain of the memory cell M1 (1, 1) is connected to the bit line BL11. Moreover, the constant voltage level period in early stages of the signal waveform of the source lines GL1i (i=2–m) is a period of the floating potential, and, for the period which lasts after that, the potential rises by the charging of the off-leak.

First, among the column selection signal lines CLPj (j=1–n) and the column selection signal lines CLNj (j=1–n), the column selection signal line CLP1 is made the transition to the low level and the column selection signal lines CLP2–CLPn are made the transition to the high level, and further, the column selection signal line CLN1 is made the transition to the high level and column selection signal lines CLN2–CLNn are made the transition to the low level. Thereby, among the transistors Q1Pj (j=1–n) and Q1Nj (j=1–n) which configure the column decoder 3, the transistor Q1P1 and the transistor Q1N1 are brought to the ON state, and the other transistors Q1P2–Q1Pn and the transistors Q1N2–Q1Nn are brought to the OFF state. Moreover, all word line terminals WL1–WLm are made the transition to the low level.

Next, the precharge control signal line PCLK1 is brought to the low level only for a period t, and the transistor 5 for precharge is brought to the ON state for a constant period of time. Thereby, the bit line BL11 is charged to bring to the high level.

After the bit line BL11 is brought to the high level, the word line terminal WL1 is made the transition from the low level being the non-selection state to the high level being the selection state. Consequently, among the N-channel MOS transistors QWi (i=1–m) configuring the source potential control circuit 11, the transistor QW1 enters into the ON state, and the source line GL11 connected to the drain is brought to the low level. Moreover, the transistors QW2–QWm enter into the OFF state, and the source lines GL12–GL1m connected to the drains are brought to a floating state. Thereby, when the drain of the memory cell M1 (1, 1) is connected to the bit line BL11, the electric charge charged in the bit line BL11 is discharged by the memory cell M1 (1, 1), and the bit line BL11 is brought to the low level. Moreover, when the drain of the memory cell M1 (1, 1) is not connected to the bit line BL11, the electric charge charged in the bit line BL11 is not discharged by the memory cell M1 (1, 1), and the bit line BL11 keeps the high level.

Consequently, in the readout circuit 7, when the drain of the memory cell M1 (1, 1) is connected to the bit line BL11, the readout data line SOUT1 is brought to the low level. Moreover, when the drain of the memory cell M1 (1, 1) is not connected to the bit line BL11, the readout data line SOUT1 is brought to the high level. At this time, by bringing the readout data selection SEL to the low level, the output selection circuit 9 outputs the data of the same level as the readout data line SOUT1 to the output terminal DOUT.

As described above, according to this embodiment, the source lines of the memory cells connected to the non-selected word line terminals are in the floating state. Accordingly, after the source lines are charged by the off-leak current for the constant period of time during precharging the bit lines, by making the potential thereof equivalent to the precharge potential of the bit lines, this makes it possible to reduce the potential difference between the sources and the drains of the non-selected memory cells, to reduce the off-leak current significantly, and to charge the bit lines to the desired potential.

Furthermore, since setting the source potential can be configured by one transistor, it is possible to reduce the area of the source potential control circuit.

3rd Embodiment

Figure 5:
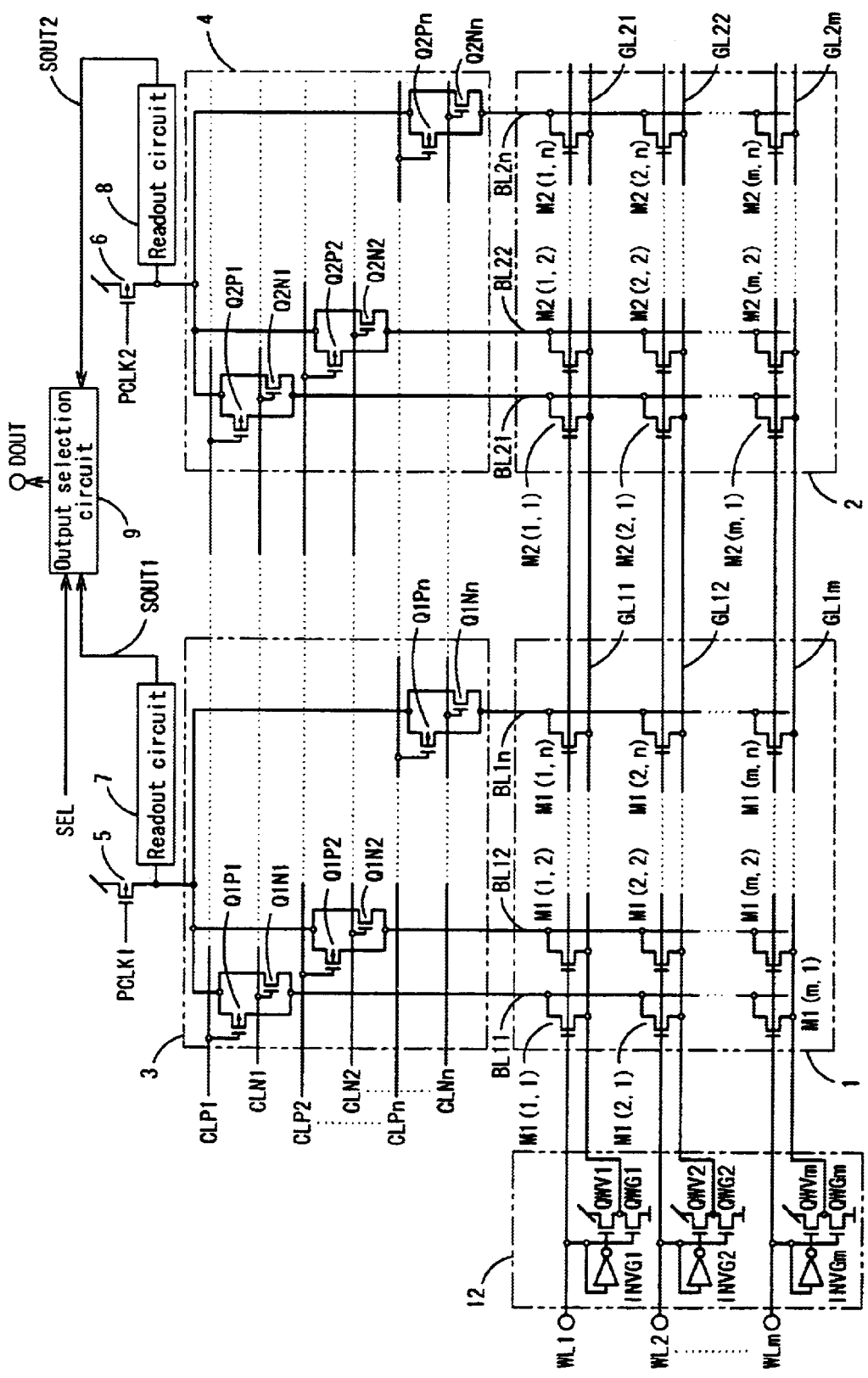
FIG. 5 is a circuit diagram showing a configuration of a semiconductor memory device according to a 3rd embodiment of the present invention.

FIG. 5 is a circuit diagram showing a configuration of a semiconductor memory device according to a 3rd embodiment of the present invention.

Referring now to FIG. 5, the semiconductor memory device comprises memory cell arrays 1 and 2, column decoders 3 and 4, transistors 5 and 6 for precharge, readout circuits 7 and 8, an output selection circuit 9, and a source potential control circuit 12. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The source potential control circuit 12 consists of inverters INVGi (i=1–m), N-channel MOS transistors QWVi (i=1–m) and N-channel MOS transistors QWGi (i=1–m). In the inverters INVGi (i=1–m), inputs are connected to the word line terminals WLi (i=1–m), respectively, and outputs are connected to the gates of the N-channel MOS transistors QWVi (i=1–m), respectively. In N-channel MOS transistors QWVi (i=1–m), gates are connected to outputs of the INVGi (i=1–m), respectively, and drains are connected to the power supply terminal having the power supply potential, and sources are connected to the source lines GL1i (i=1–m) and the source lines GL2i (i=1–m), respectively. In the N-channel MOS transistors QWGi (i=1–m), gates are connected to the word line terminals WLi (i=1–m), respectively, drains are connected to the source lines GL1i (i=1–m) and source lines GL2i (i=1–m), respectively, and sources are connected to the ground terminal having the ground potential.

Figure 6:
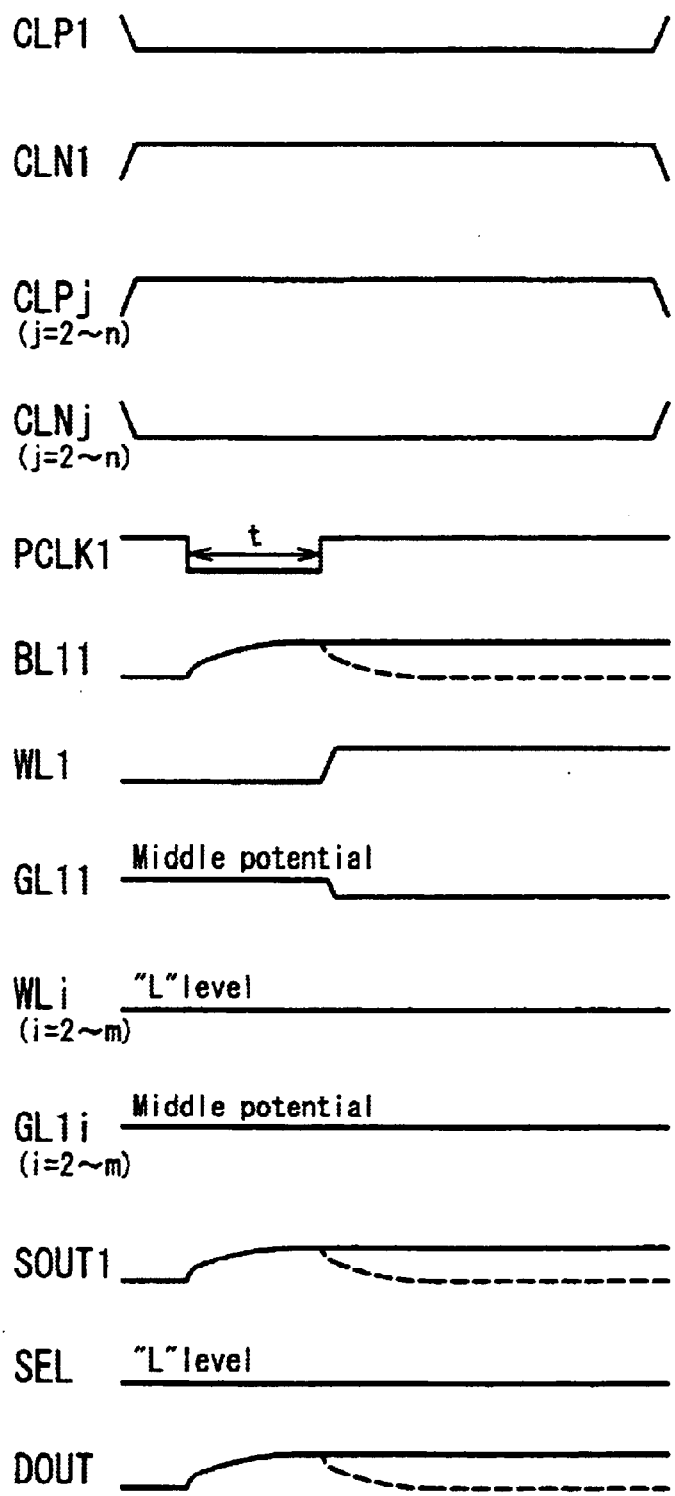
FIG. 6 is a timing chart showing an operation of a semiconductor memory device according to the 3rd embodiment of the present invention.

Using the timing chart in FIG. 6, a description will be made of an operation for reading the data of the memory cell M1 (1, 1) in the semiconductor memory device configured as mentioned above. In signal waveforms of the bit line BL11, the readout data line SOUT1, and the output terminal DOUT shown in FIG. 6, the solid lines show a case where the drain of the memory cell M1 (1, 1) is not connected to the bit line BL11, and the dotted lines show a case where the drain of the memory cell M1 (1, 1) is connected to the bit line BL11.

First, among the column selection signal lines CLPj (j=1–n) and the column selection signal lines CLNj (j=1–n), the column selection signal line CLP1 is made the transition to the low level and the column selection signal lines CLP2–CLPn are made the transition to the high level, and further, the column selection signal line CLN1 is made the transition to the high level and column selection signal lines CLN2–CLNn are made the transition to the low level. Thereby, among the transistors Q1Pj (j=1–n) and Q1Nj (j=1–n) which configure the column decoder 3, the transistor Q1P1 and the transistor Q1N1 are brought to the ON state, and the other transistors Q1P2–Q1Pn and the transistors Q1N2–Q1Nn are brought to the OFF state. Moreover, all word line terminals WL1–WLm are made the transition to the low level.

Next, the precharge control signal line PCLK1 is brought to the low level only for a period t, and the transistor 5 for precharge is brought to the ON state for a constant period of time. Thereby, the bit line BL11 is charged to bring to the high level.

After the bit line BL11 is brought to the high level, the word line terminal WL1 is made the transition from the low level being the non-selection state to the high level being the selection state. Consequently, among the N-channel MOS transistors QWVi (i=1-m) and QWGi (i=1-m) configuring the source potential control circuit 12, the transistor QWV1 enters the OFF state, the transistor QWG1 enters the ON state, and the source line GL11 is brought to the low level. Moreover, the transistors QWV2–QWVm enter the ON state, and the transistors QWG2–QWGm enters the OFF state, the source lines GL12–GL1m connected to the drain is brought to a potential equal to [(supply voltage)—(threshold voltage of the N-channel MOS transistor QWVi)]. Thereby, when the drain of the memory cell M1 (1, 1) is connected to the bit line BL11, the electric charge charged in the bit line BL11 is discharged by the memory cell M1 (1, 1), and the bit line BL11 is brought to the low level. Moreover, when the drain of the memory cell M1 (1, 1) is not connected to the bit line BL11, the electric charge charged in the bit line BL11 is not discharged by the memory cell M1 (1, 1), and the bit line BL11 keeps the high level.

Consequently, in the readout circuit 7, when the drain of the memory cell M1 (1, 1) is connected to the bit line BL11, the readout data line SOUT1 is brought to the low level. Moreover, when the drain of the memory cell M1 (1, 1) is not connected to the bit line BL11, the readout data line SOUT1 is brought to the high level. At this time, by bringing the readout data selection SEL to the low level, the output selection circuit 9 outputs the data of the same level as the readout data line SOUT1 to the output terminal DOUT.

As described above, according to this embodiment, the source lines of the memory cells connected to the non-selected word line terminals are brought to a middle potential, the potential difference between the sources and the drains of the non-selected memory cells is reduced, and the off-leak current is reduced significantly, making it possible to precharge the bit lines to the desired potential.

Furthermore, when changing the source lines from the non-selection to the selection, since it is made the transition not from the high level but from the middle potential to the low level, the transition time can be shortened, and enhancement of the readout speed can be achieved.

4th Embodiment

Figure 7:
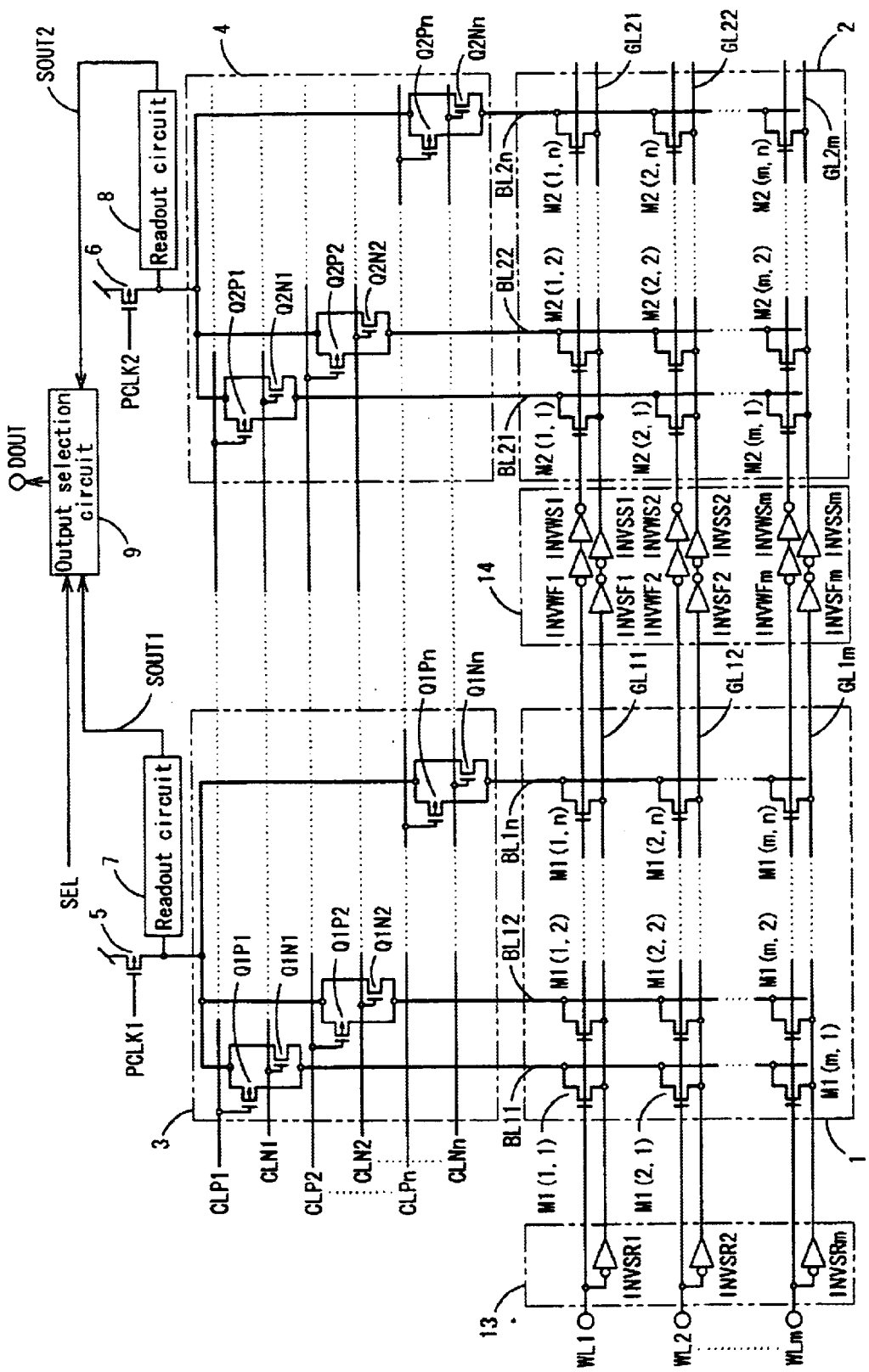
FIG. 7 is a circuit diagram showing a configuration of a semiconductor memory device according to a 4th embodiment of the present invention.

FIG. 7 is a circuit diagram showing a configuration of a semiconductor memory device according to a 4th embodiment of the present invention.

Referring now to FIG. 7, the semiconductor memory device comprises memory cell arrays 1 and 2, column decoders 3 and 4, transistors 5 and 6 for precharge, readout circuits 7 and 8, an output selection circuit 9, a source potential control circuit 13, and a repeat circuit 14. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The source potential control circuit 13 consists of inverters INVSRi (i=1–m). In inverters INVSRi (i=1–m), inputs are connected to the word line terminals WLi (i=1–m), respectively, and outputs are connected to the source lines GL1i (i=1–m), respectively.

The repeat circuit 14 consists of inverters INVWFi (i=1–m), inverters INVWSi (i=1–m), inverters INVSFi (i=1–m), and inverters INVSSi (i=1–m). In inverters INVWFi (i=1–m), inputs are connected to the word line terminals WLi (i=1–m), respectively, and outputs are connected to inputs of the inverters INVWSi (i=1–m), respectively. Moreover, in the inverters INVWSi (i=1–m), outputs are connected to gates of the memory cells M2 (i, j) (i=1–m, j=1–n) which configure the memory cell array 2, respectively. In inverters INVSFi (i=1–m), inputs are connected to the sources of the memory cells M1 (i, j), i.e., the source lines GL1i, (i=1–m), respectively, and outputs are connected to inputs of the inverters INVSSi (i=1–m), respectively. In inverters INVSSi (i=1–m), outputs are connected to the sources of the memory cells M2 (i, j) (i=1–m, j=1–n), which configure the memory cell array 2, i.e., the source lines GL2i (i=1–m), respectively.

Figure 8:
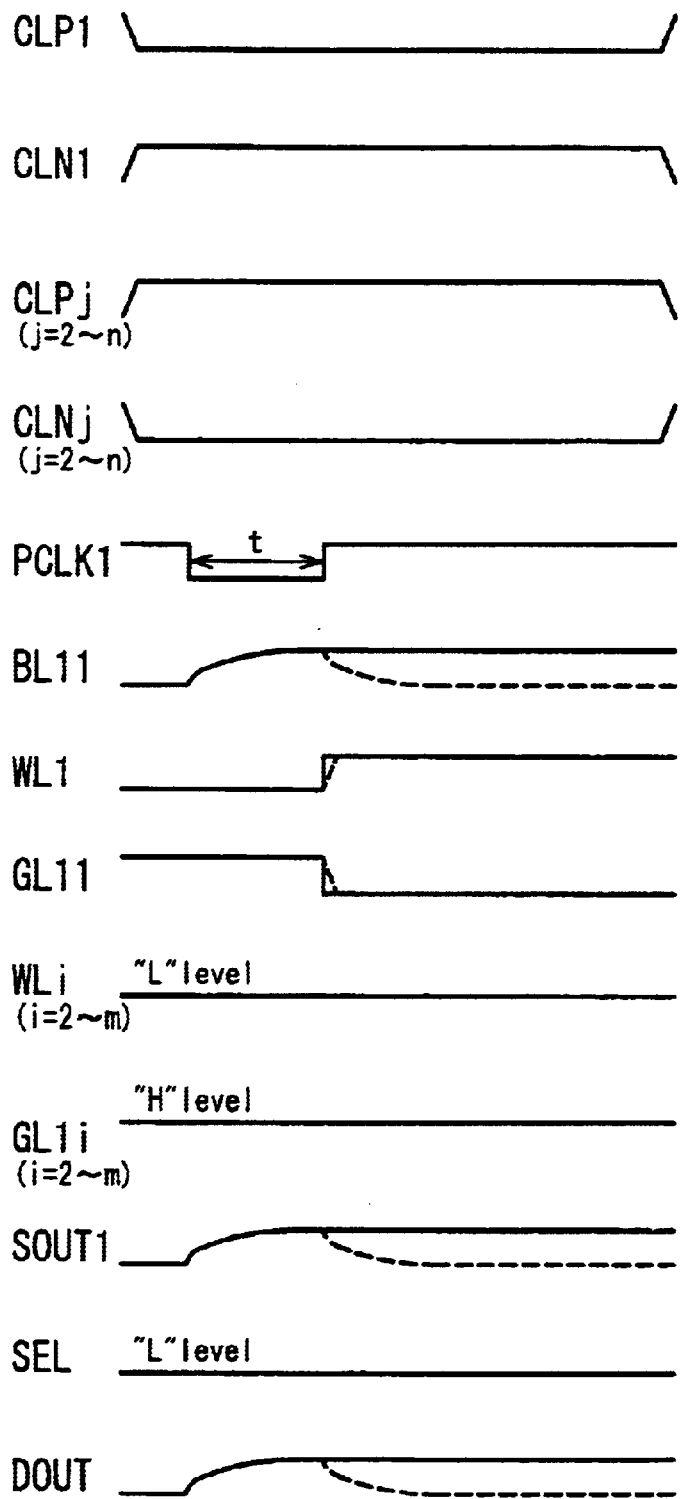
FIG. 8 is a timing chart showing an operation of a semiconductor memory device according to the 4th embodiment of the present invention.

Using the timing chart in FIG. 8, a description will be made of an operation for reading the data of the memory cell M1 (1, 1) in the semiconductor memory device configured as mentioned above. In signal waveforms of the bit line BL11, the readout data line SOUT1, and the output terminal DOUT shown in FIG. 8, the solid lines show a case where the drain of the memory cell M1 (1, 1) is not connected to the bit line BL11, and the dotted lines show a case where the drain of the memory cell M1 (1, 1) is connected to the bit line BL11. Moreover, in the signal waveforms of the word line WL1 and the source line GL11, the solid lines show the case of this preferred embodiment, and the dotted lines show the case of the 1st preferred embodiment.

First, among the column selection signal lines CLPj (j=1–n) and the column selection signal lines CLNj (j=1–n), the column selection signal line CLP1 is made the transition to the low level, the column selection signal lines CLP2–CLPn are made the transition to the high level, further, the column selection signal line CLN1 is made the transition to the high level and column selection signal lines CLN2–CLNn are made the transition to the low level. Thereby, among the transistors Q1Pj (j=1–n) and Q1Nj (j=1–n) which configure the column decoder 3, the transistor Q1P1 and the transistor Q1N1 are brought to the ON state, and the other transistors Q1P2–Q1Pn and the transistors Q1N2–Q1Nn are brought to the OFF state. Moreover, all word line terminals WL1–WLm are made the transition to the low level.

Next, the precharge control signal line PCLK1 is brought to the low level only for a period t, and the transistor 5 for precharge is brought to the ON state for a constant period of time. Thereby, the bit line BL11 is charged to bring to the high level.

After the bit line BL11 is brought to the high level, the word line terminal WL1 is made the transition from the low level being the non-selection state to the high level being the selection state. Consequently, in the source potential control circuit 13, the source line GL11 connected to the output of the inverter INVSR1 is brought to the low level, and source lines GL12–GL1m connected to the outputs of the inverters INVSR2–INVSRm are brought to the high level.

Moreover, in the repeat circuit 14, the transitions of the word line terminals WLi (i=1–m) are inputted (transferred) into the gates of the memory cells M2 (i, j) (i=1–m, j=1–n), which configure the memory cell array 2, in phase by the inverters INVWFi (i=1–m) and the inverters INVWSi (i=1–m), respectively, and the transitions of the source lines GL1i (i=1–m) are inputted (transferred) into the source lines GL2i (i=1–m), which configure the memory cell array 2, in phase by the inverters INVSFi (i=1–m) and the inverters INVSSi (i=1–m), respectively.

Thereby, when the drain of the memory cell M1 (1, 1) is connected to the bit line BL11, the electric charge charged in the bit line BL11 is discharged by the memory cell M1 (1, 1), and the bit line BL11 is brought to the low level. On the other hand, when the drain of the memory cell M1 (1, 1) is not connected to the bit line BL11, the electric charge charged in the bit line BL11 is not discharged by the memory cell M1 (1, 1), and the bit line BL11 keeps the high level.

Consequently, in the readout circuit 7, when the drain of the memory cell M1 (1, 1) is connected to the bit line BL11, the readout data line SOUT1 is brought to the low level. Moreover, when the drain of the memory cell M1 (1, 1) is not connected to the bit line BL11, the readout data line SOUT1 is brought to the high level. At this time, by bringing the readout data selection SEL to the low level, the output selection circuit 9 outputs the data of the same level as the readout data line SOUT1 to the output terminal DOUT.

As described above, according to this embodiment, the driving force of the word lines and the source lines can be enhanced by inserting circuits for buffering the signals of the word lines and the signals of the source lines in a location between the memory cell arrays 1 and 2, respectively, i.e., by inserting the repeat circuit 14. Furthermore, in addition to the effect of the 1st embodiment, it becomes possible to make the transition of the word lines and the source lines to the desired potential at high speed, and also becomes possible to achieve enhancement of the readout speed.

5th Embodiment

Figure 9:
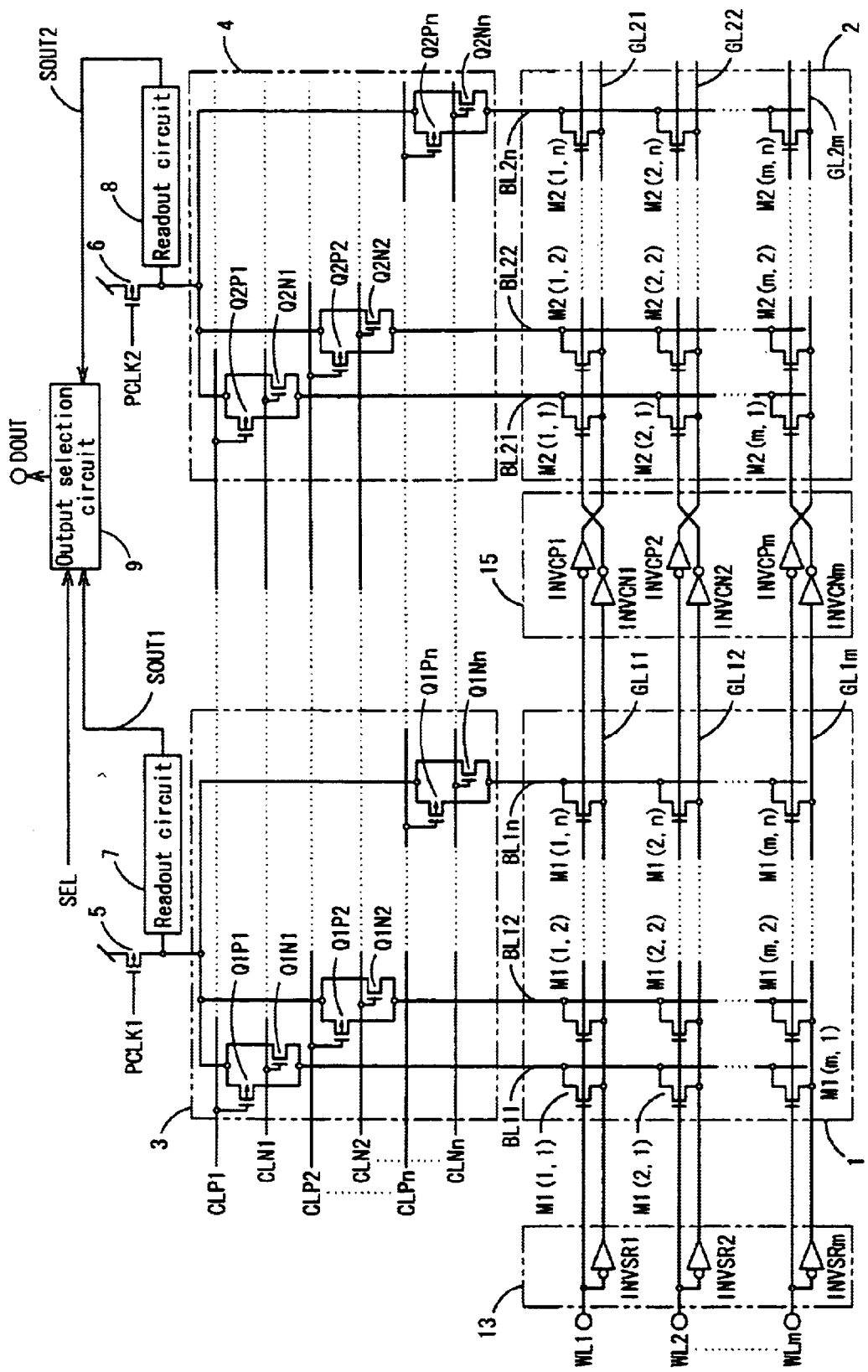
FIG. 9 is a circuit diagram showing a configuration of a semiconductor memory device according to a 5th embodiment of the present invention.

FIG. 9 is a circuit diagram showing a configuration of a semiconductor memory device according to a 5th embodiment of the present invention.

Referring now to FIG. 9, the semiconductor memory device comprises memory cell arrays 1 and 2, column decoders 3 and 4, transistors 5 and 6 for precharge, readout circuits 7 and 8, an output selection circuit 9, a source potential control circuit 13, and a repeat circuit 15. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The repeat circuit 15 consists of inverters INVCPi (i=1–m) and inverters INVCNi (i=1–m). In the inverters INVCPi (i=1–m), inputs are connected to the word line terminals WLi (i=1–m), respectively, and outputs are connected to the source lines GL2i (i=1–m), respectively. In the inverters INVCNi (i=1–m), inputs are connected to the source lines GL1i (i=1–m), and outputs are connected to the gates of the memory cells M2 (i, j), which configure the memory cell array 2, respectively.

Since the configuration of those other than the repeat circuit 15 is the same as that of the 4th embodiment, the same symbol is given thereto and the explanation is omitted.

Using the timing chart shown in FIG. 8 as in the 4th embodiment, a description will be made of an operation for reading the data of the memory cell M1 (1, 1) in the semiconductor memory device configured as mentioned above.

In the repeat circuit 15, the transitions of the word lines WLi (i=1–m) are inputted (transferred) into the source lines GL2i (i=1–m), which configure the memory cell array 2, in antiphase by the inverters INVCPi (i=1–m), respectively. Moreover, the transitions of the source lines GL1i (i=1–m) are inputted (transferred) into the gates of the memory cells M2 (i, j) (i=1–m, j=1–n), which configure the memory cell array 2, in antiphase by the inverters INVCNi (i=1–m), respectively.

As described above, according to this embodiment, the driving force of the word lines and the source lines can be enhanced by inserting buffers consisting of one inverter circuit in the word lines and the source lines, respectively, in a location between the memory cell arrays 1 and 2, i.e., by inserting the repeat circuit 15. Furthermore, in addition to the effect of the 1st embodiment, it becomes possible to make the transition of the word lines and the source lines to the desired potential at high speed with fewer elements than that of the 4th embodiment, and to achieve enhancement of the readout speed.

6th Embodiment

Figure 10:
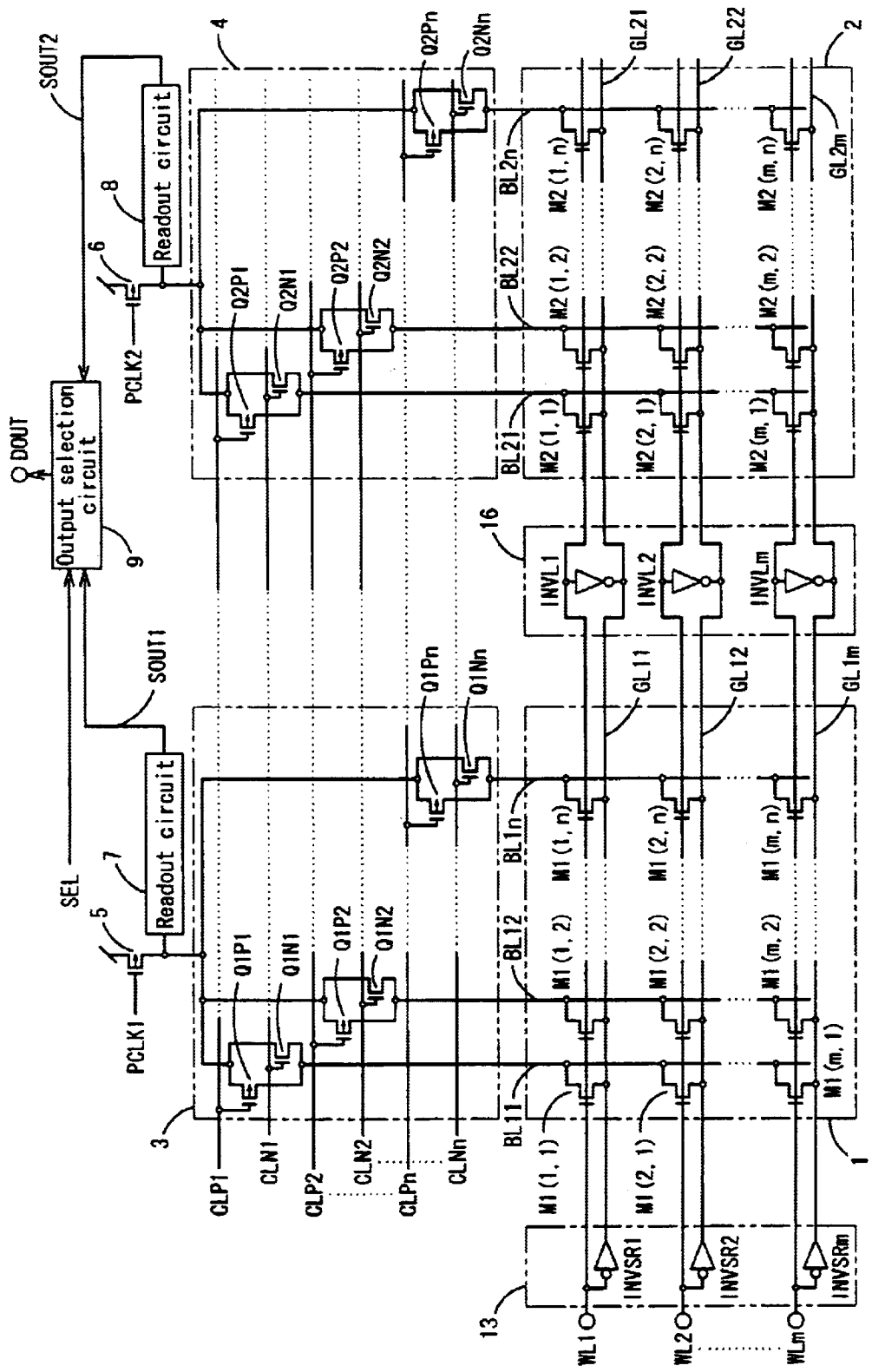
FIG. 10 is a circuit diagram showing a configuration of a semiconductor memory device according to a 6th embodiment of the present invention.

FIG. 10 is a circuit diagram showing a configuration of a semiconductor memory device according to a 6th embodiment of the present invention.

Referring now to FIG. 10, the semiconductor memory device comprises memory cell arrays 1 and 2, column decoders 3 and 4, transistors 5 and 6 for precharge, readout circuits 7 and 8, an output selection circuit 9, a source potential control circuit 13, and a repeat circuit 16. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The repeat circuit 16 consists of inverters INVLi (i=1–m). In the inverters INVLi (i=1–m), inputs are connected to the word line terminals WLi (i=1–m), respectively, and outputs are connected to the source lines GL1i (i=1–m) and GL2i (i=1–m), respectively.

Figure 11:
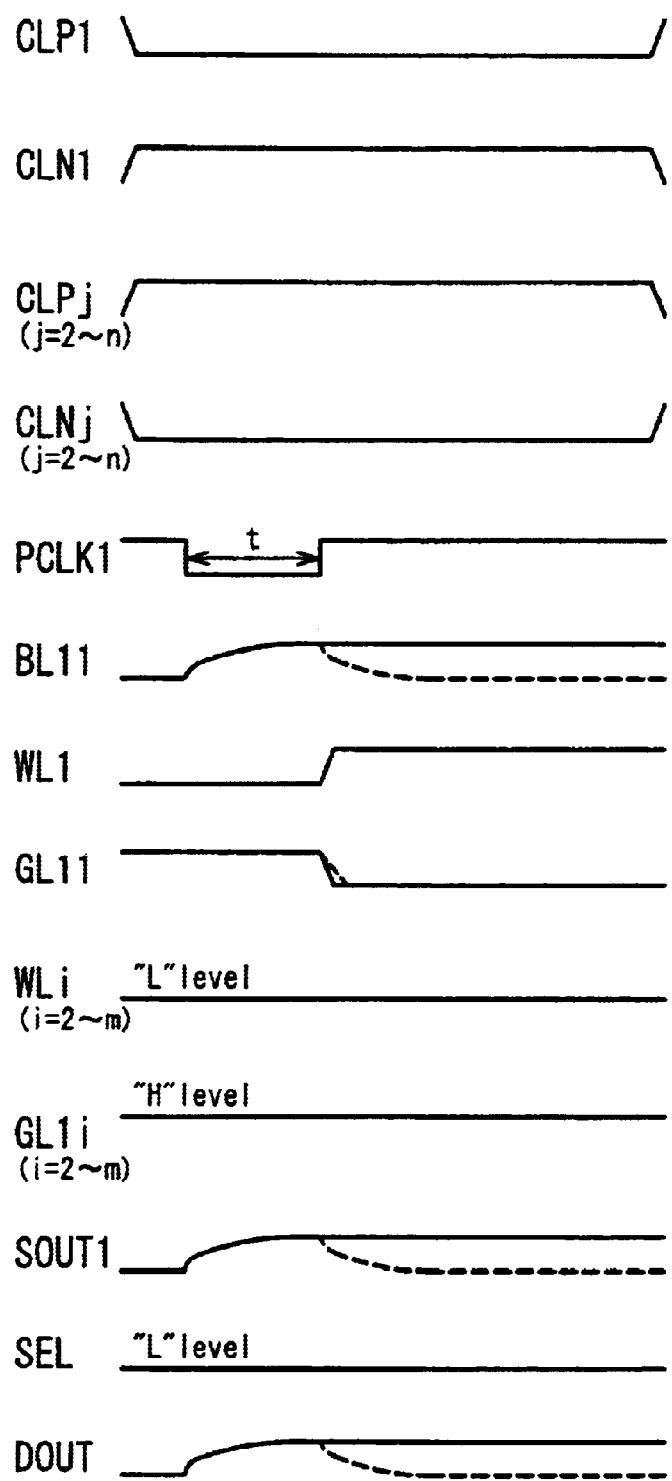
FIG. 11 is a timing chart showing an operation of a semiconductor memory device according to the 6th embodiment of the present invention.

Using the timing chart of FIG. 11, a description will be made of an operation for reading data of a memory cell M1 (1, 1) in the semiconductor memory device configured as mentioned above. In signal waveforms of the bit line BL11, the readout data line SOUT1, and the output terminal DOUT shown in FIG. 11, the solid lines show a case where the drain of the memory cell M1 (1, 1) is not connected to the bit line BL11, and the dotted lines show a case where the drain of the memory cell M1 (1, 1) is connected to the bit line BL11. Moreover, in the signal waveforms of the source line GL11, the solid lines show the case of this preferred embodiment, and the dotted lines show the case of the 1st preferred embodiment.

Since the configuration of those other than repeat circuit 16 is the same as that of the 5th embodiment, the same symbol is given thereto and the explanation is omitted.

In the repeat circuit 16, the transitions of the word lines WLi (i=1–m) are inputted (transferred) into the source lines GL1i (i=1–m) and the source lines GL2i (i=1–m) in antiphase by the inverters INVLi (i=1–m), respectively.

As described above, according to this embodiment, the driving force of the wordlines and the source lines can be enhanced by inserting buffers consisting of inverter circuits between the word lines and the source lines, respectively, in a location between the memory cell arrays 1 and 2, i.e., by inserting the repeat circuit 16. Furthermore, in addition to the effect of the 1st embodiment, it becomes possible to make the transition of the source lines to the desired potential at high speed with fewer elements than that of the 5th embodiment, and to achieve enhancement of the readout speed.

In addition, in this embodiment, although an example for enhancement of the transition speed of the source lines by arranging the buffers which make the word lines as the inputs and connect the outputs to the source lines between the cell arrays 1 and 2 is shown, when enhancing the speed of the transition of the word lines, enhancement of the readout speed can be achieved by making the source lines as the input and connecting the output to the word lines.

7th Embodiment

Figure 12:
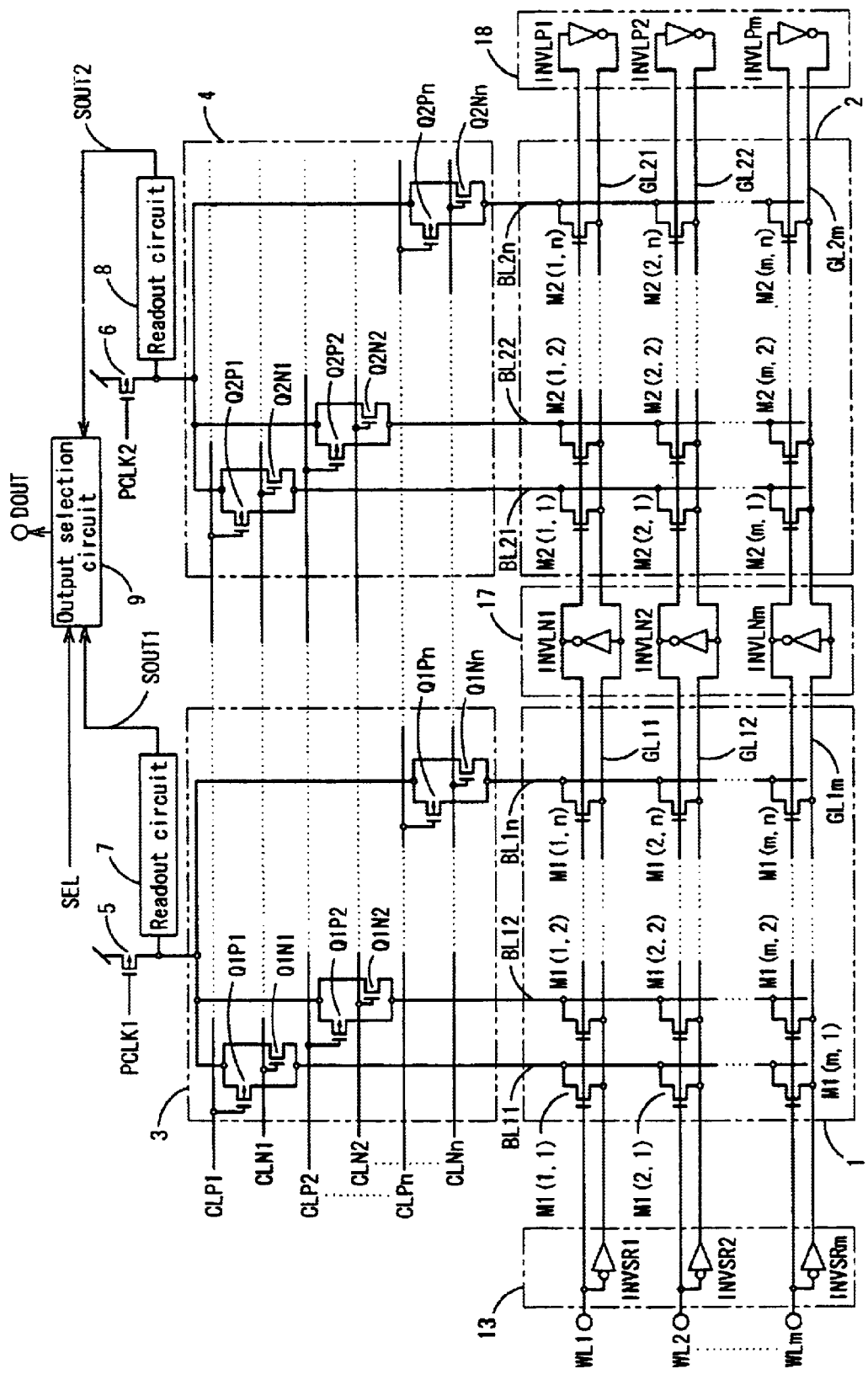
FIG. 12 is a circuit diagram showing a configuration of a semiconductor memory device according to a 7th embodiment of the present invention.

FIG. 12 is a circuit diagram showing a configuration of a semiconductor memory device according to a 7th embodiment of the present invention.

Referring now to FIG. 12, the semiconductor memory device comprises memory cell arrays 1 and 2, column decoders 3 and 4, transistors 5 and 6 for precharge, readout circuits 7 and 8, an output selection circuit 9, a source potential control circuit 13, and repeat circuits 17 and 18. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

A repeat circuit 17 consists of inverters INVLNi (i=1–m). In the inverters INVLNi (i=1–m), inputs are connected to the source lines GL1i (i=1–m) and GL2i (i=1–m), respectively, and outputs are connected to each word line of the memory cell arrays 1 and 2, and word line terminals WLi (i=1–m), respectively.

A repeat circuit 18 consists of inverters INVLPi (i=1–m). In the inverters INVLPi (i=1–m), inputs are connected to each word line of the memory cell arrays 1 and 2, and word line terminals WLi (i=1–m), respectively, and outputs are connected to the source lines GL1i (i=1–m) and GL2i (i=1–m), respectively.

Using a timing chart shown in FIG. 8 as in the 5th embodiment, a description will be made of an operation for reading the data of the memory cell M1 (1, 1) in the semiconductor memory device configured as mentioned above.

Since the configuring except arranging the repeat circuit 17 and the repeat circuit 18 instead of the repeat circuit 15 is the same as that of the 5th embodiment, the same symbol is given thereto and the explanation is omitted.

In the repeat circuit 17, the transitions of the source lines GL1i (i=1–m) are inputted (transferred) into the gates of the memory cells M1 (i, j) (i=1–m, j=1–n) and the memory cells M2 (i, j) (i=1–m, j=1–n) in antiphase by the inverters INVLNi (i=1–m), respectively.

Moreover, in the repeat circuit 18, the transitions of the word lines WLi (i=1–m) are inputted (transferred) into the sources of the memory cells M1 (i, j) (i=1–m, j=1–n) and the memory cells M2 (i, j) (i=1–m, j=1–n) in antiphase by the inverters INVLPi (i=1–m), respectively.

As described above, according to this embodiment, buffers which consists of inverter circuits are inserted between the word lines and the source lines, respectively, that is, the repeat circuits 17 and 18 are inserted in a location between the memory cell arrays 1 and 2, and a location on the right-hand side of the memory cell 2, respectively. Specifically, the buffers (inverters INVLNi (i=1–m)) making the source lines as the inputs and connecting the outputs to the word lines, and the buffers (inverters INVLPi (i=1–m)) making the word lines as the inputs and connecting the outputs to the source lines are inserted at constant intervals, for example, every one or more memory cell arrays. Thereby, the driving force of the source lines and the word lines can be enhanced. Furthermore, in addition to the effect of the 1st embodiment, it becomes possible to make the transition of the word lines and the source lines to the desired potential at high speed with fewer elements than that of the 5th embodiment, and to achieve enhancement of the readout speed.

8th Embodiment

Figure 13:
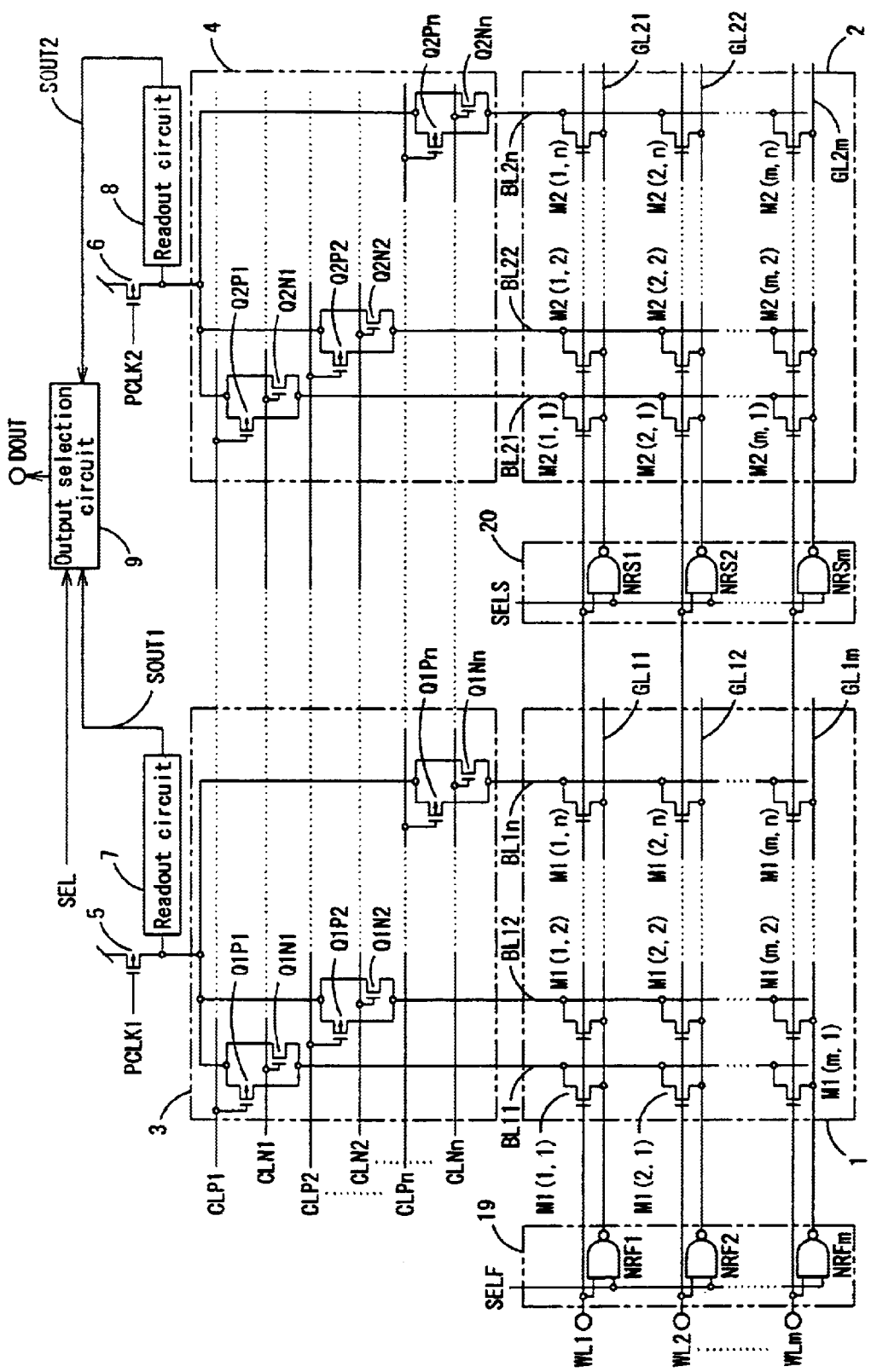
FIG. 13 is a circuit diagram showing a configuration of a semiconductor memory device according to a 8th embodiment of the present invention.

FIG. 13 is a circuit diagram showing a configuration of a semiconductor memory device according to a 8th embodiment of the present invention.

Referring now to FIG. 13, the semiconductor memory device comprises memory cell arrays 1 and 2, column decoders 3 and 4, transistors 5 and 6 for precharge, readout circuits 7 and 8, an output selection circuit 9, and source potential control circuits 19 and 20. Since the memory cell arrays 1 and 2, the column decoders 3 and 4, the transistors 5 and 6 for precharge, the readout circuits 7 and 8, and the output selection circuit 9 are the same as that of the conventional example, the same symbol is given to the same component and the explanation is omitted.

The source potential control circuit 19 consist of NAND circuits NRFi (i=1–m). In the NAND-circuits NRFi (i=1–m), a source potential control circuit selection signal line SELF is connected to one of the inputs, the wordline terminals WLi (i=1–m) are connected to other inputs, respectively, and outputs are connected to the source lines GL1i (i=1–m), respectively.

The source potential control circuit 20 consists of NAND circuits NRSi (i=1–m). In the NAND-circuits NRSi (i=1–m), the source potential control circuit selection signal line SELS is connected to one of inputs, the word line terminals WLi (i=1–m) are connected to other inputs, respectively, and outputs are connected to source lines GL2i (i=1–m), respectively.

Figure 14:
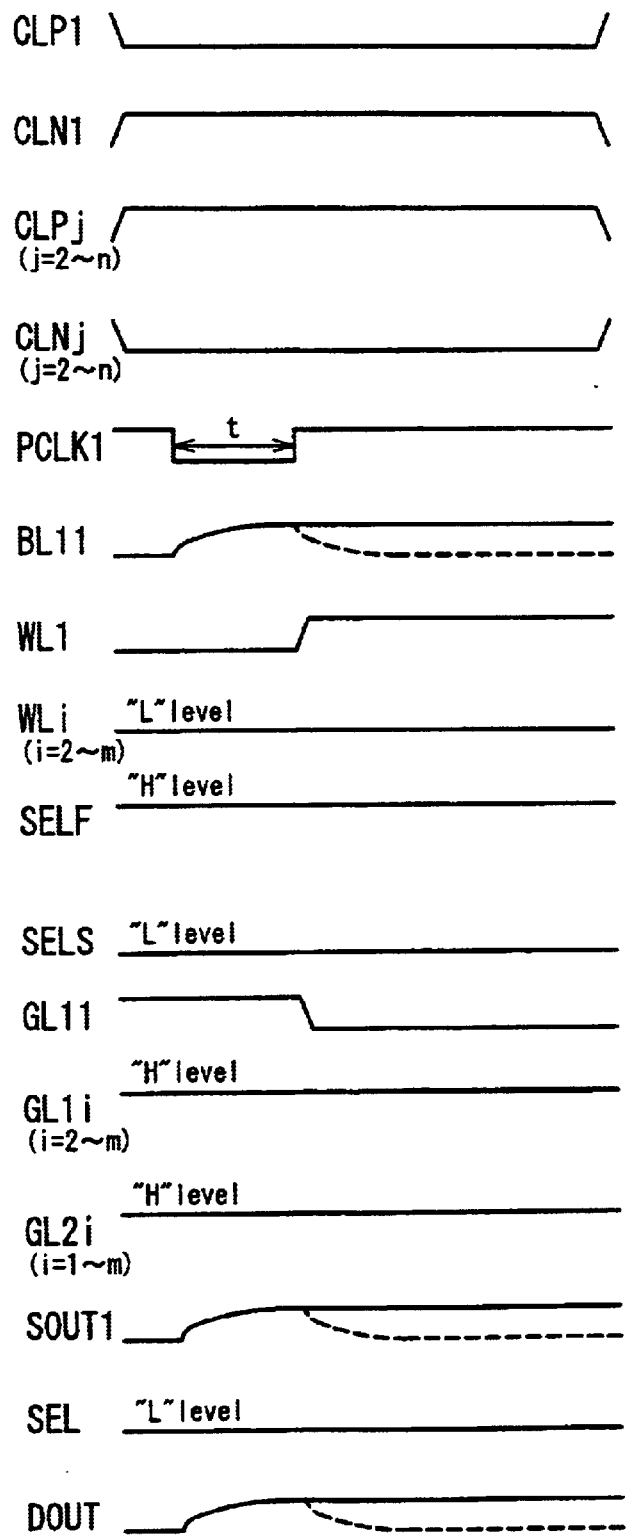
FIG. 14 is a timing chart showing an operation of a semiconductor memory device according to the 8th embodiment of the present invention.

Using the timing chart of FIG. 14, a description will be made of an operation for reading data of a memory cell M1 (1, 1) in the semiconductor memory device configured as mentioned above. In signal waveforms of the bit line BL11, the readout data line SOUT1, and the output terminal DOUT shown in FIG. 14, the solid lines show a case where the drain of the memory cell M1 (1, 1) is not connected to the bit line BL11, and the dotted lines show a case where the drain of the memory cell M1 (1, 1) is connected to the bit line BL11.

First, among the column selection signal lines CLPj (j=1–n) and the column selection signal lines CLNj (j=1–n), the column selection signal line CLP1 is made the transition to the low level and the column selection signal lines CLP2–CLPn are made the transition to the high level, and further, the column selection signal line CLN1 is made the transition to the high level and column selection signal lines CLN2–CLNn are made the transition to the low level. Thereby, among the transistors Q1Pj (j=1–n) and Q1Nj (j=1–n) which configure the column decoder 3, the transistor Q1P1 and the transistor Q1N1 are brought to the ON state, and the other transistors Q1P2–Q1Pn and the transistors Q1N2–Q1Nn are brought to the OFF state. Moreover, all word line terminals WL1–WLm are made the transition to the low level.

Next, the precharge control signal line PCLK1 is brought to the low level only for a period t, and the transistor 5 for precharge is brought to the ON state for a constant period of time. Thereby, the bit line BL11 is charged to bring to the high level.

After the bit line BL11 has been brought to the high level, the word line terminal WL1 is brought to the high level being the selection state from the low level being the non-selection state, furthermore, the source potential control circuit selection signal SELF is brought to the high level, and the source potential control circuit selection signal SELS is brought to the low level. Thereby, the source line GL11 connected to the output of the NAND circuit NRF1 among the NAND circuits NRFi (i=1–m) in the source potential control circuit 19 is brought to the low level. Moreover, the source lines GL12–GL1m connected to the outputs of the NAND-circuits NRF2–NRFm are brought the high level. Moreover, in the source potential control circuit 20, the source lines GL2i (i=1–m) connected to the outputs of the NAND circuits NRSi (i=1–m) are brought to the high level.

Thereby, when the drain of the memory cell M1 (1, 1) is connected to the bit line BL11, the electric charge charged in the bit line BL11 is discharged by the memory cell M1 (1, 1), and the bit line BL11 is brought to the low level. On the other hand, when the drain of the memory cell M1 (1, 1) is not connected to the bit line BL11, the electric charge charged in the bit line BL11 is not discharged by the memory cell M1 (1, 1), and thus the bit line BL11 keeps the high level.

Consequently, in the readout circuit 7, when the drain of the memory cell M1 (1, 1) is connected to the bit line BL11, the readout data line SOUT1 is brought to the low level. Moreover, when the drain of the memory cell M1 (1, 1) is not connected to the bit line BL11, the readout data line SOUT1 is brought to the high level. At this time, by bringing the readout data selection line SEL to the low level, the output selection circuit 9 outputs the data of the same level as the readout data line SOUT1 to the output terminal DOUT.

As described above, according to this embodiment, among the memory cell arrays where the selected memory cell is arranged, the source lines of the memory cells connected to the non-selected word line terminals are brought to the high level, making its level equivalent to the precharge potential of the bit lines. This makes it possible to reduce the potential difference between the sources and the drains of the non-selected memory cells, to reduce the off-leak current significantly, and to charge the bit lines to the desired potential. In addition, in the memory cell array where the selected memory cell is not arranged, the off-leak current which flows from the sources of the memory cells to the bit lines being the drains thereof can be reduced by setting the potential of the source lines at the high potential, and low-power dissipation can be achieved.

9th Embodiment

Figure 15:
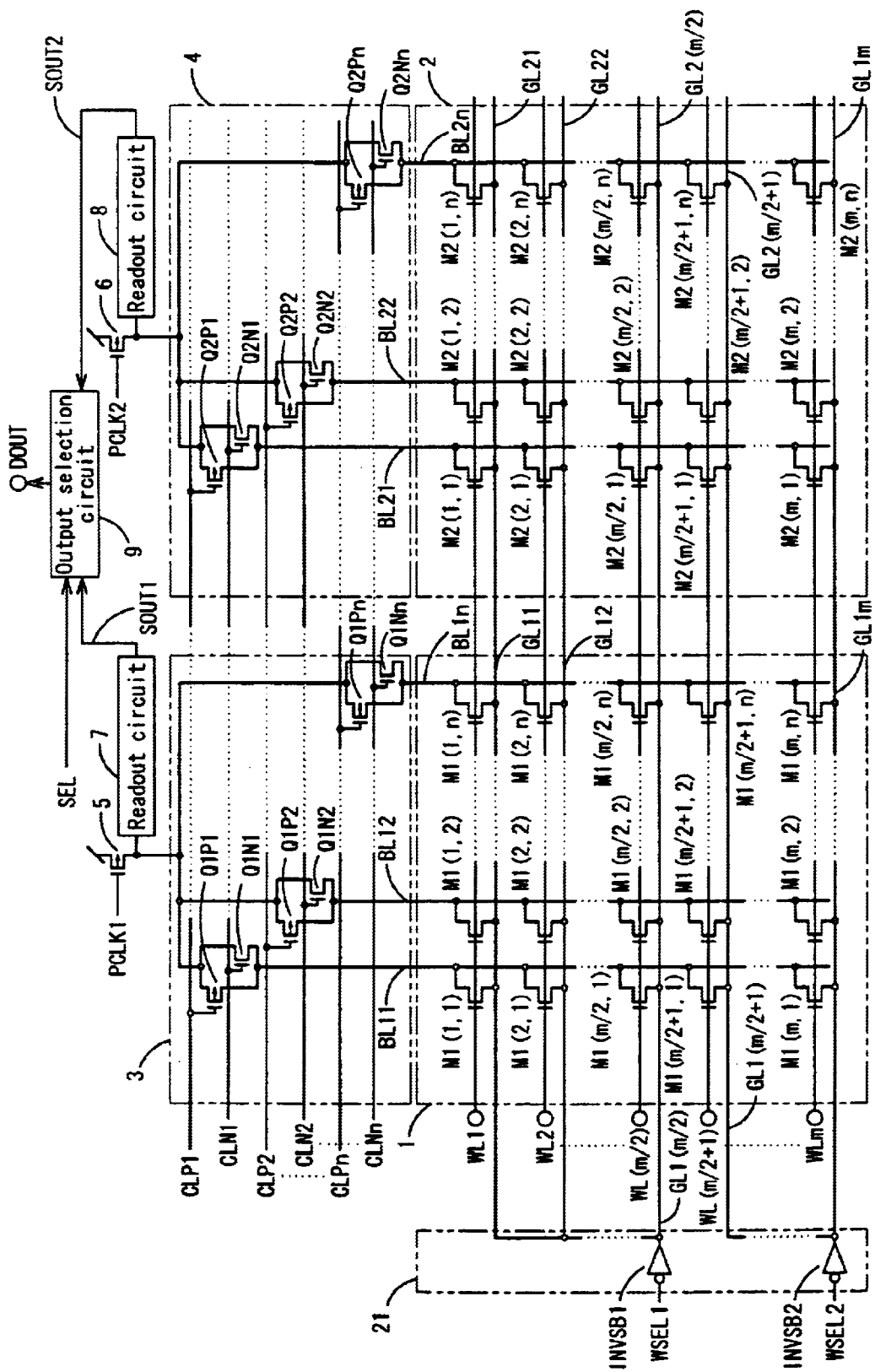
FIG. 15 is a circuit diagram showing a configuration of a semiconductor memory device according to a 9th embodiment of the present invention.

FIG. 15 is a circuit diagram showing a configuration of a semiconductor memory device according to a 9th embodiment of the present invention.

Referring now to FIG. 15, the semiconductor memory device comprises memory cell arrays 1 and 2, column decoders 3 and 4, transistors 5 and 6 for precharge, readout circuits 7 and 8, an output selection circuit 9, and a source potential control circuit 21. Since the memory cell arrays 1 and 2, the column decoders 3 and 4, the transistors 5 and 6 for precharge, the readout circuits 7 and 8, and the output selection circuit 9 are the same as those of the conventional example, the same symbol is given to the same component and the explanation is omitted.

The source potential control circuit 21 consists of an inverter INVSB1 and an inverter INVSB2. In the inverter INVSB1, an input is connected to a source potential control signal WSEL1, and an output is connected to the source lines GL11–GL1 (m/2) and source lines GL21–GL2 (m/2). In the inverter INVSB2, an input is connected to a source potential control signal WSEL2, and an output is connected to source lines GL1 (m/2+1)–GL1m and source lines GL2 (m/2+1)–GL2m.

Figure 16:
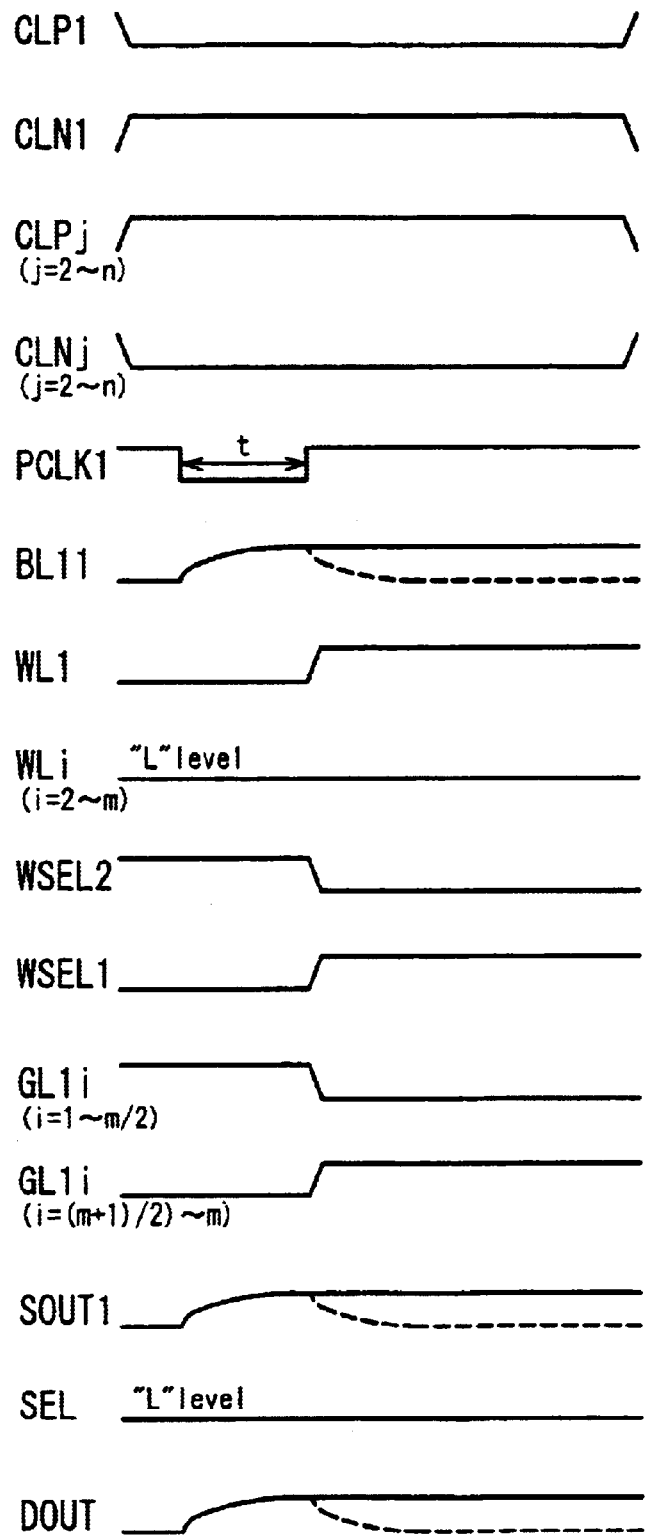
FIG. 16 is a timing chart showing an operation of a semiconductor memory device according to the 9th embodiment of the present invention.
Figure 17:
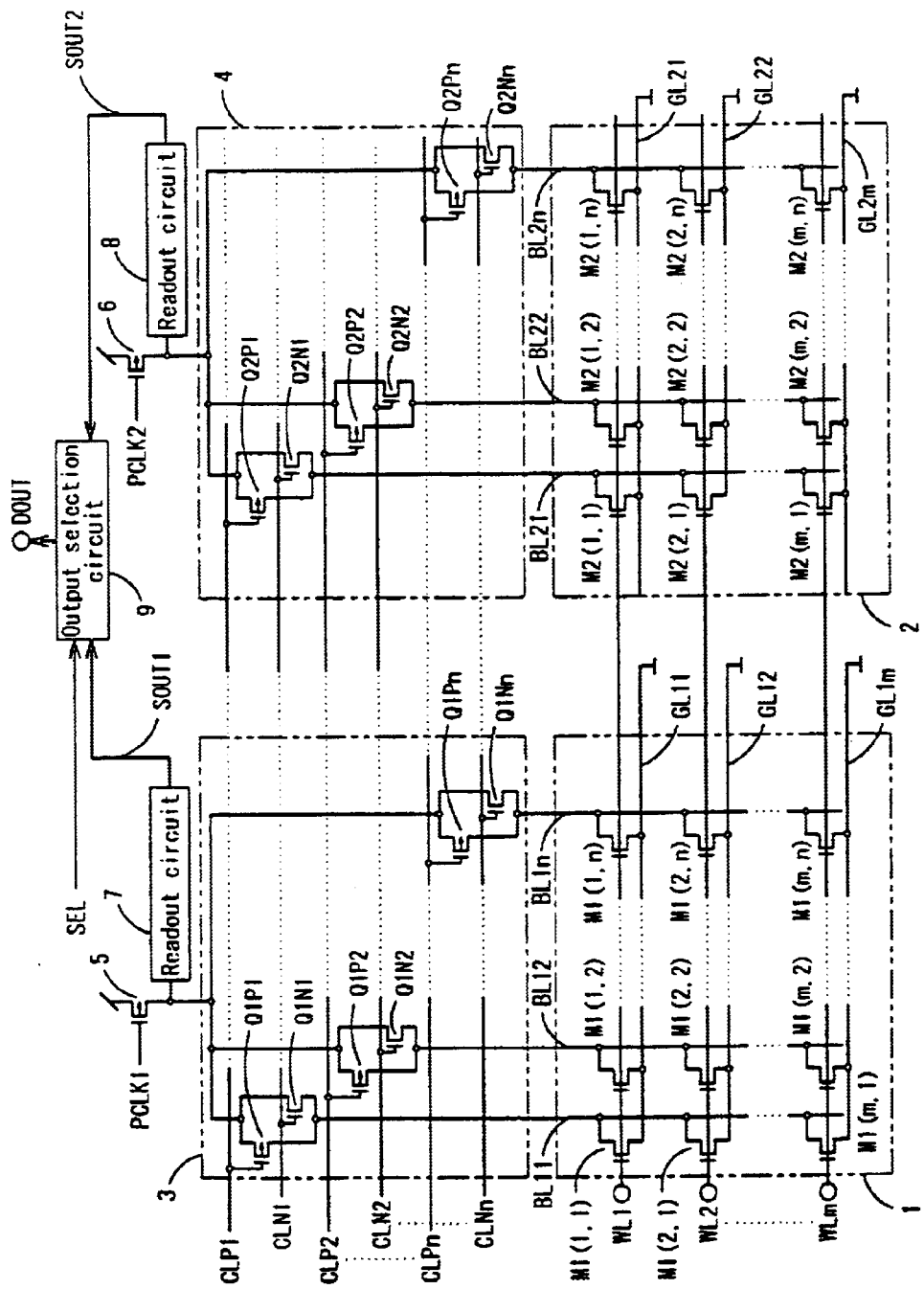
FIG. 17 is a circuit diagram showing a configuration of a conventional semiconductor memory device.

Using the timing chart of FIG. 16, a description will be made of an operation for reading data of a memory cell M1 (1, 1) in the semiconductor memory device configured as mentioned above. In signal waveforms of the bit line BL11, the readout data line SOUT1, and the output terminal DOUT shown in FIG. 16, the solid lines show a case where the drain of the memory cell M1 (1, 1) is not connected to the bit line BL11, and the dotted lines show a case where the drain of the memory cell M1 (1, 1) is connected to the bit line BL11.

Since the configuration and the operation of those other than the source potential control circuit 21 are the same as that of the 1st embodiment, the same symbol is given thereto and the explanation is omitted.

As for the source potential control signal WSEL1, if any of the word line terminals WL1–WL (m/2) is in the high level being the selection state, the high level will be inputted and, if all word line terminals WL1–WL (m/2) are in the low level being the non-selection state, the low level will be inputted.

Moreover, as for the source potential control signal WSEL2, if any of the word line terminals WL (m/2+1)–WLm is in the high level being the selection state, the high level will be inputted, and if all word line terminals WL (m/2+1)–WLm are in the low level, the low level signal will be inputted.

Under these conditions, the word line terminal WL1 is brought to the high level being the selection state from the state where all word line terminals WLi (i=1–m) are in the low level, the high level is also inputted as the source potential control signal WSEL1, and the low level is further inputted as the source potential control signal WSEL2. Thereby, the source lines GL11–GL1 (m/2) connected to the output of the inverter INVSB1 which configures the source potential control circuit 21 is brought to the low level. Moreover, the source lines GL1 (m/2+1)–GL1m connected to the output of the inverter INVSB2 is brought to the high level.

As described above, according to this embodiment, by bringing the source lines of the plurality of memory cells connected to the non-selected word lines to the high level, the potential difference between the sources and the drains of a plurality of memory cells, drains of which are connected to the bit lines, and gates thereof are connected to the word lines being in the non-selection state, is reduced. Consequently, the off-leak current can be reduced significantly and this makes it possible to charge the bit lines to the desired potential. In addition, since the potential of a plurality of source lines is set by one inverter circuit, the source potential control circuit can configured with fewer elements, making it possible to reduce the area.

What is claimed is:

1. A semiconductor memory device, comprising:
 a memory cell array having transistors for forming a plurality of memory cells arranged in a matrix configuration, and including a plurality of word lines, bit lines, and source lines connected to gates, drains, and sources of the transistors respectively; and
 a source potential control circuit for selectively setting potentials of said source lines according to row selection signals for selecting said word lines,
 wherein said source potential control circuit sets potentials of source lines, out of said source lines, connected to unselected memory cells, in accordance with said row selection signals, at a potential different from that of a source line connected to memory cells being selected by said row selection signals so that an off-leak current of transistors included in memory cells being set as a non-selection state may decrease.

2. The semiconductor memory device according to claim 1, wherein said source potential control circuit sets a source potential of transistors for memory cells being selected by said row selection signals at a ground potential, and a source potential of transistors for the memory cells being set as a non-selection state by said row selection signals at a power supply potential.

3. The semiconductor memory device according to claim 2, wherein said source potential control circuit comprises inverters each for receiving a corresponding one of the row selection signals as an input, and providing an output to sources of corresponding ones of the transistors which receive the corresponding one of said row selection signals.

4. A semiconductor memory device, comprising:
 a memory cell array having transistors for forming a plurality of memory cells arranged in a matrix configuration, and including a plurality of word lines, bit lines, and source lines connected to gates, drains, and sources of the transistors respectively; and
 a source potential control circuit for setting a source potential of transistors for memory cells being selected by row selection signals for selecting said word lines at a ground potential, and for setting a source potential of transistors for memory cells being set as a non-selection state by said row selection signals at a floating state.

5. The semiconductor memory device according to claim 4, wherein said source potential control circuit comprises transistors each receiving a corresponding one of the row selection signals to the gate thereof, having a source connected to the ground terminal, and having a drain connected to sources of corresponding ones of the transistors which receive the corresponding one of said row selection signals.

6. The semiconductor memory device according to claim 1, wherein said source potential control circuit sets a source potential of transistors for memory cells being selected by said row selection signals at a ground potential, and a source potential of transistor for memory cells being set as a non-selection state by the row selection signals are set at an intermediate potential between a power supply potential and the ground potential.

7. The semiconductor memory device according to claim 6, wherein said source potential control circuit comprises:
 inverters which receives the row selection signals as inputs;
 1st transistors each having a gate connected to an output of a corresponding one of said inverters, having a drain connected to a power supply terminal, and having a source connected to sources of corresponding ones of the transistors which receive a corresponding one of said row selection signals; and
 2nd transistors each having a gate receiving a corresponding one of said row selection signals, having a source connected to the ground potential, and having a drain connected to sources of corresponding ones of the transistors which receive the corresponding one of said row selection signals.

8. The semiconductor memory device according to claim 1, wherein said plurality of memory cells are arranged into a plurality of memory cell arrays, and the semiconductor memory device further comprises:
 a 1st repeat circuit including 1st inverters connected to corresponding ones of said word lines at inputs thereof, and 2nd inverters connected to outputs of the 1st inverters at inputs thereof; and
 a 2nd repeat circuit including 3rd inverters connected to corresponding ones of the source lines at inputs thereof and 4th inverters connected to outputs of the 3rd inverters at inputs thereof,
 wherein
  in said 1st repeat circuit, outputs of said 2nd inverters are connected to word lines provided in a memory cell array different from a memory cell array in which word lines connected to the inputs of the 1st inverters are provided,
  in said 2nd repeat circuit, outputs of said 4th inverters are connected to source lines provided in a memory cell array different from a memory cell array in which source lines connected to the inputs of the 3rd inverters are provided, and
  said 1st repeat circuit and said 2nd repeat circuit are formed between at least two of the memory cell arrays.

9. The semiconductor memory device according to claim 1, wherein said plurality of memory cells are arranged into a plurality of memory cell arrays, and the semiconductor memory device further comprises
 a repeat circuit including 1st inverters connected to corresponding ones of the source lines at inputs thereof and 2nd inverters connected to outputs of said 1st inverters at inputs thereof,
 wherein
  in said repeat circuit, outputs of said 2nd inverters are connected to source lines provided in a memory cell array different from a memory cell array in which source lines connected to the inputs of the 1st inverters are provided and
  said repeat circuit is formed between at least two of the memory cell arrays.

10. The semiconductor memory device according to claim 1, wherein said plurality of memory cells are arranged into a plurality of memory cell arrays, and the semiconductor memory device further comprises
 1st inverters connected to said word lines at inputs thereof and to the source lines at outputs thereof, and 2nd inverters connected to the source lines at inputs thereof and to the word lines at outputs thereof,
 wherein
  the outputs of said 1st inverters connect to source lines provided in a memory cell array different from a memory cell array in which word lines connected to the inputs of said 1st inverters are provided,
  outputs of said 2nd inverters connect to word lines provided in a memory cell array different from a memory cell array in which source lines connected to the inputs of said 2nd inverters are provided, and the 1st inverters and the 2nd inverters are formed between at least two of the memory cell arrays.

11. The semiconductor memory device according to claim 1, wherein said plurality of memory cells are arranged into a plurality of memory cell arrays, and the semiconductor memory device further comprises a repeat circuit including inverters connected to corresponding ones of the word lines at inputs thereof, and connected to corresponding ones of the source lines at outputs thereof, wherein said repeat circuit is formed between at least two of the memory cell arrays.

12. The semiconductor memory device according to claim 1, wherein said plurality of memory cells are arranged into a plurality of memory cell arrays, and the semiconductor memory device further comprises a repeat circuit including inverters connected to corresponding ones of the source lines at inputs thereof, and connected to corresponding ones of the word lines at outputs thereof, wherein said repeat circuit is formed between at least two of the memory cell arrays.

13. The semiconductor memory device according to claim 1, wherein said plurality of memory cells are arranged into a plurality of memory cell arrays, and the semiconductor memory device further comprises:

a 1st repeat circuit including inverters connected to corresponding ones of said word lines at the inputs thereof, and connected to corresponding ones of the source lines; and a 2nd repeat circuit including inverters connected to the source lines to inputs, and connecting the word lines of the same rows as the inputs to outputs, wherein said 1st repeat circuit and said 2nd repeat circuit are each formed between at least two of the memory cell arrays.

14. A semiconductor memory device, comprising:

a plurality of memory cell arrays having transistors for forming a plurality of memory cells in a matrix configuration, and including a plurality of word lines, bit lines, and source lines connected to gates, drains, and sources of the transistors respectively; and a source potential control circuit for receiving row selection signals for selecting said word lines and memory cell array selection signals provided for respective memory cell arrays at inputs thereof, respectively, for supplying outputs to respective source lines in a corresponding one of the memory cell arrays and for setting a potential of source lines connected to transistors included in memory cells selected by said memory cell array selection signals and said row selection signals at a ground potential, wherein said source potential control circuit is formed in each memory cell array.

15. The semiconductor memory device according to claim 14, wherein said source potential control circuit comprises NAND circuits for receiving the row selection signals for selecting said word lines, and the memory cell array selection signals provided for respective memory cell arrays at inputs thereof, respectively, and for providing outputs to respective source lines in the corresponding one of the memory cell array.

16. A semiconductor memory device, comprising:

a memory cell array having transistors for forming a plurality of memory cells in a matrix configuration, and including a plurality of word lines, bit lines, and source lines connected to gates, drains, and sources of the transistors respectively; and a plurality of source line potential control circuits each connected to a source selection line at inputs thereof and connected to a plurality of source lines at outputs thereof, wherein the plurality of source line potential control circuits set a potential of source lines connected to transistors included in memory cells selected by the row selection signals for selecting said word line at a ground potential.

17. A semiconductor memory device, comprising:

a memory cell array having transistors for forming a plurality of memory cells in a matrix configuration, and including word lines, bit lines, and source lines connected to gates, drains, and sources of the transistors respectively; and a plurality of inverters for receiving source potential control signals at inputs thereof and providing outputs to a plurality of source lines, wherein only an output potential of an inverter, out of said inverters, connected to a source line of transistors included in memory cells selected by said row selection signals is set at a ground potential.

* * * * *